(12) United States Patent
Hachiya et al.

(10) Patent No.: US 11,644,249 B2
(45) Date of Patent: May 9, 2023

(54) ELECTRONIC APPARATUS

(71) Applicant: NEC Corporation, Tokyo (JP)

(72) Inventors: Mahiro Hachiya, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 114 days.

(21) Appl. No.: 17/040,731

(22) PCT Filed: Mar. 29, 2019

(86) PCT No.: PCT/JP2019/013972
§ 371 (c)(1),
(2) Date: Sep. 23, 2020

(87) PCT Pub. No.: WO2019/194089
PCT Pub. Date: Oct. 10, 2019

(65) Prior Publication Data
US 2021/0010757 A1 Jan. 14, 2021

(30) Foreign Application Priority Data

Apr. 2, 2018 (JP) .............................. JP2018-071069

(51) Int. Cl.
*H01L 23/427* (2006.01)
*H05K 7/20* (2006.01)
(Continued)

(52) U.S. Cl.
CPC .............. *F28D 15/04* (2013.01); *G06F 1/20* (2013.01); *H01L 23/427* (2013.01); *G06F 2200/201* (2013.01); *H05K 7/20336* (2013.01)

(58) Field of Classification Search
CPC ..................................................... H01L 23/427
See application file for complete search history.

(56) References Cited

U.S. PATENT DOCUMENTS

| | | | |
|---|---|---|---|
| 7,002,247 B2 * | 2/2006 | Mok | H01L 24/31 257/713 |
| 7,019,973 B2 * | 3/2006 | Rivera | H01L 23/4332 257/722 |

(Continued)

FOREIGN PATENT DOCUMENTS

| | | |
|---|---|---|
| JP | S59-188198 A | 10/1984 |
| JP | S61-237993 A | 10/1986 |

(Continued)

OTHER PUBLICATIONS

International Search Report for PCT Application No. PCT/JP2019/013972, dated Jun. 11, 2019.
(Continued)

*Primary Examiner* — Robert J Hoffberg
(74) *Attorney, Agent, or Firm* — Sughrue Mion, PLLC

(57) ABSTRACT

This electronic apparatus 100 comprises a heating element 20, and a case 30. The case 30 has an opening hole 31. In order that a refrigerant COO will be sealed between the case 30 and the heating element 20, the outer periphery part of a first heating element external surface 21, which is the external surface of the heating element 20, is attached to the outer periphery part of the opening hole 31. Also, the refrigerant COO is a refrigerant that is capable of phase
(Continued)

change from a liquid refrigerant LP-COO to a gas phase refrigerant GP-COO. As a result, it is possible to more efficiently cool the heat of the heating element 20.

10 Claims, 17 Drawing Sheets

(51) Int. Cl.
    *F28D 15/04*     (2006.01)
    *G06F 1/20*     (2006.01)

(56) References Cited

U.S. PATENT DOCUMENTS

| | | | |
|---|---|---|---|
| 10,399,190 B2 * | 9/2019 | North | B23P 15/26 |
| 10,772,187 B2 * | 9/2020 | Mitsui | H05K 1/0201 |
| 2006/0039111 A1 * | 2/2006 | Huang | H01L 23/427 |
| | | | 361/698 |
| 2006/0090881 A1 | 5/2006 | Tuma | |
| 2006/0196640 A1 * | 9/2006 | Siu | H01L 23/473 |
| | | | 257/E23.103 |
| 2006/0209512 A1 | 9/2006 | Taniguchi et al. | |
| 2010/0018678 A1 * | 1/2010 | Siu | F28D 15/046 |
| | | | 165/104.33 |
| 2010/0328889 A1 | 12/2010 | Campbell et al. | |
| 2013/0039012 A1 * | 2/2013 | Shih | H01L 23/473 |
| | | | 361/700 |
| 2022/0151113 A1 * | 5/2022 | Hachiya | H05K 7/1427 |

FOREIGN PATENT DOCUMENTS

| | | | |
|---|---|---|---|
| JP | H11-087586 A | | 3/1999 |
| JP | 2006-261457 A | | 9/2006 |
| JP | 2008-518468 A | | 5/2008 |
| JP | 2008-153423 A | | 7/2008 |
| JP | 2009-206369 A | | 9/2009 |
| JP | 2012-531056 A | | 12/2012 |
| JP | 2020123653 A | * | 8/2020 |
| WO | WO-2020195301 A1 | * | 10/2020 |

OTHER PUBLICATIONS

English translation of Written opinion for PCT Application No. PCT/JP2019/013972, dated Jun. 11, 2019.

* cited by examiner

ELECTRONIC APPARATUS

This application is a National Stage Entry of PCT/JP2019/013972 filed on Mar. 29, 2019, which claims priority from Japanese Patent Application 2018-071069 filed on Apr. 2, 2018, the contents of all of which are incorporated herein by reference, in their entirety.

TECHNICAL FIELD

The present invention relates to an electronic apparatus and, for example, relates to a technology for an electronic apparatus cooling a heat-generating body.

BACKGROUND ART

In recent years, with technological development of cloud services and the like, an amount of information processing is increasing. In order to process the enormous amount of information, an amount of calculation performed by heat-generating bodies such as a central processing unit (CPU) and a multi-chip module (MCM) has a tendency to increase. Consequently, heating values of the heat-generating bodies also have a tendency to increase. With the tendency, attempts to more efficiently cool heat-generating bodies are being made on a daily basis.

An electronic apparatus cooling a heat-generating body by use of a coolant is known as a cooling technology of a heat-generating body (such as PTL 1).

A technology described in PTL 1 cools a heat-generating body by use of a vapor chamber. A heat-receiving surface of the vapor chamber is mounted on the heat-generating body. A wick group aggregating a plurality of wicks is placed in an enclosed space (working fluid tank) between a case and a cover in the vapor chamber. A coolant (working fluid) is sealed in the enclosed space.

The vapor chamber receives heat of the heat-generating body through the heat-receiving surface. The heat of the heat-generating body received through the heat-receiving surface is transferred to a wick. Consequently, a coolant included in the wick boils and evaporates, undergoes a phase change from a liquid phase to a gas phase, and spreads to the cover side. The coolant spread to the cover side condenses and liquefies on a cover wall surface, and undergoes a phase change from the gas phase to the liquid phase. Heat emitted as latent heat of condensation is emitted to the air through an outer surface of the cover. The liquefying coolant is refluxed to the heat-generating body through the wick by a capillary force and repeats evaporation and condensation in the enclosed space again.

Technologies related to the present invention are also disclosed in PTLs 2 to 5.

CITATION LIST

Patent Literature

PTL 1: Japanese Unexamined Patent Application Publication No. 2008-153423

PTL 2: Japanese Unexamined Patent Application Publication No. S59-188198

PTL 3: Japanese Translation of PCT International Application Publication No. 2012-531056

PTL 4: Japanese Unexamined Patent Application Publication No. H11-087586

PTL 5: Japanese Unexamined Patent Application Publication No. S61-237993

SUMMARY OF INVENTION

Technical Problem

However, in the technology described in PTL 1, the heat-generating body is mounted on the heat-receiving surface of the vapor chamber, and heat of the heat-generating body is transferred to the coolant through the case of the vapor chamber. At this time, a gap is generated between the heat-generating body and the case of the vapor chamber, and therefore the heat of the heat-generating body is not sufficiently transferred to the coolant. Consequently, a temperature rise of the coolant in the vapor chamber is suppressed. Consequently, there is a problem that a phase change of the coolant from a liquid phase to a gas phase is suppressed, and the heat of the heat-generating body is not sufficiently cooled.

The present invention has been made in view of such circumstances, and an object of the present invention is to provide an electronic apparatus capable of more efficiently cooling heat of a heat-generating body.

Solution to Problem

An electronic apparatus according to the present invention includes: a heat-generating body; and an enclosure including an opening, an outer circumferential part of a first heat-generating body outer surface being an outer surface of the heat-generating body being mounted on an outer circumferential part or an inner circumferential part of the opening in such a way that a coolant that can undergo a phase change to a liquid-phase coolant and a gas-phase coolant is hermetically sealed between the enclosure and the heat-generating body.

Advantageous Effects of Invention

The present invention can provide an electronic apparatus capable of more efficiently cooling heat of a heat-generating body.

EXAMPLE EMBODIMENT

First Example Embodiment

An electronic apparatus 100 according to a first example embodiment of the present invention will be described based on drawings.

Figure 1:
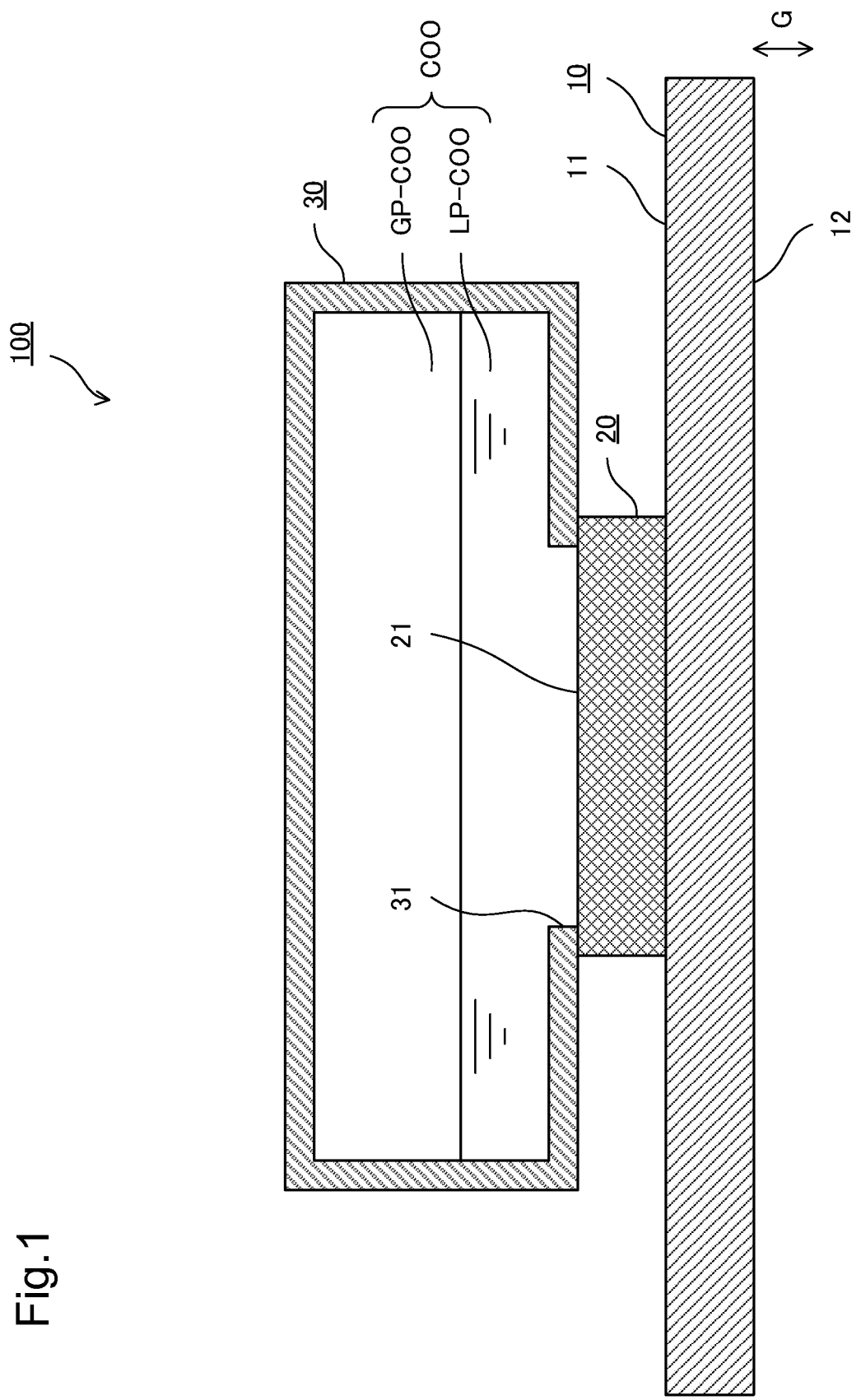
FIG. 1 is a cross-sectional view illustrating a structure of an electronic apparatus according to a first example embodiment of the present invention and illustrates a section at an A-A cutting plane in FIG. 4.
Figure 2:
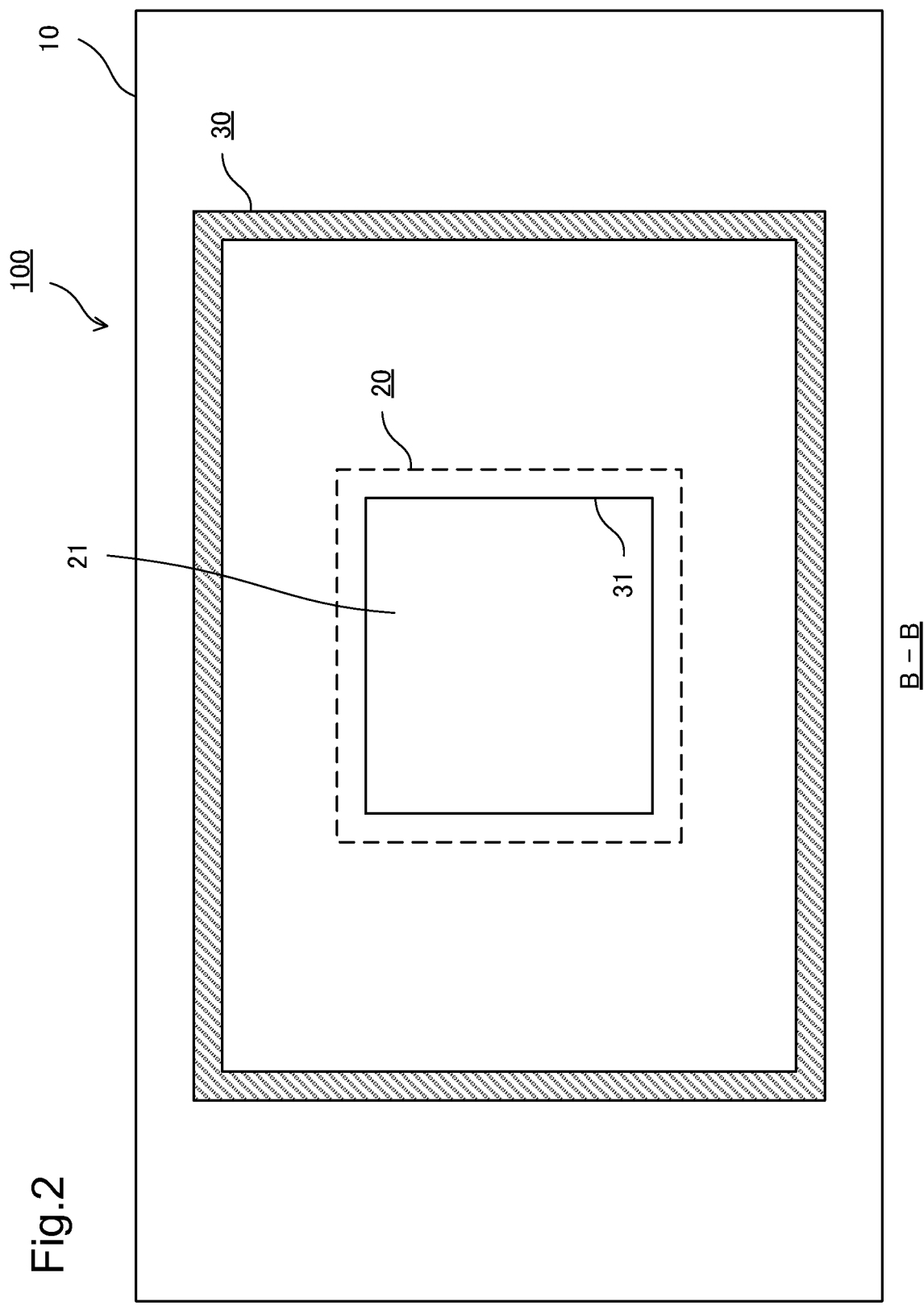
FIG. 2 is a cross-sectional view illustrating the structure of the electronic apparatus according to the first example embodiment of the present invention and illustrates a section at a B-B cutting plane in FIG. 3.
Figure 3:
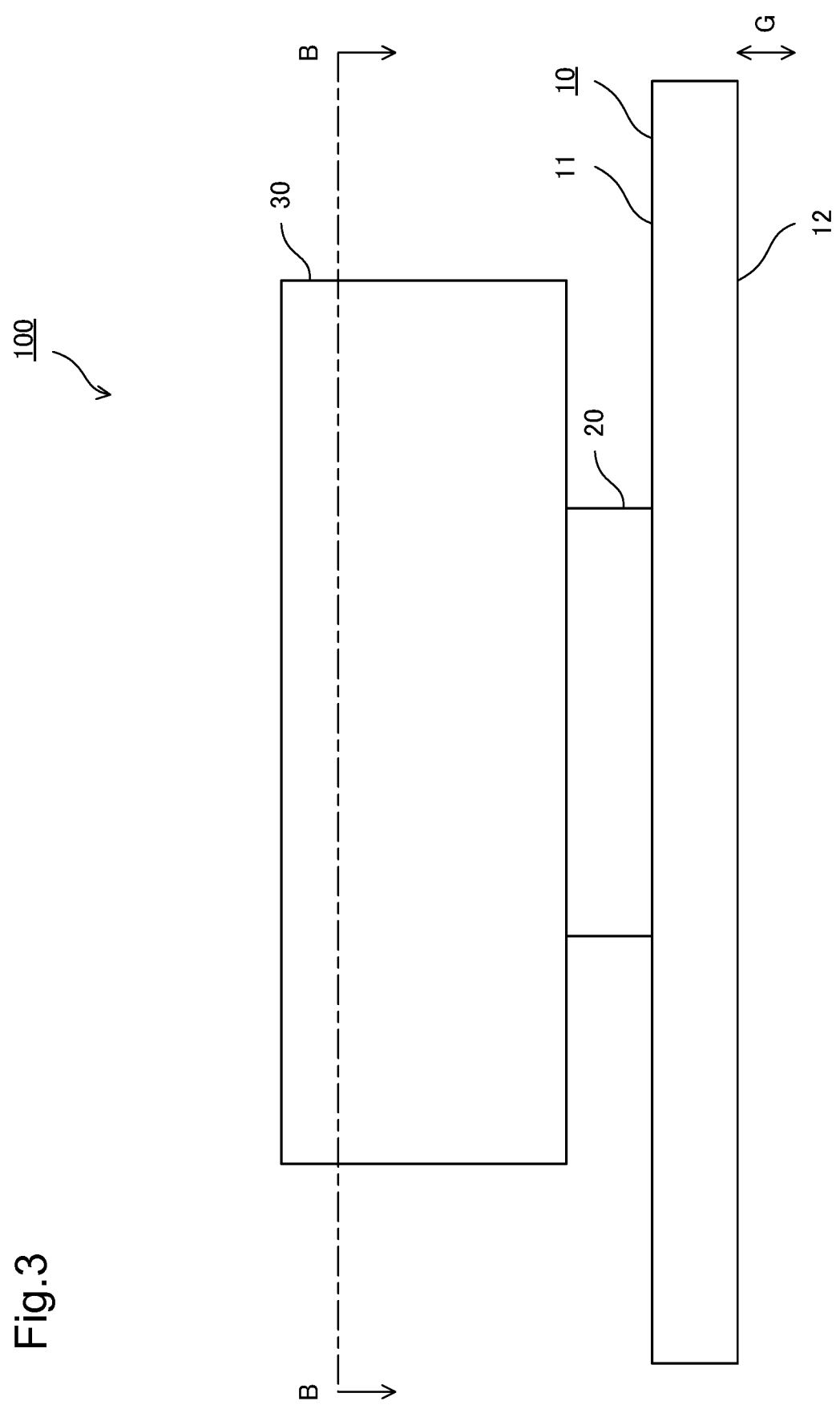
FIG. 3 is a side view illustrating the structure of the electronic apparatus according to the first example embodiment of the present invention.
Figure 4:
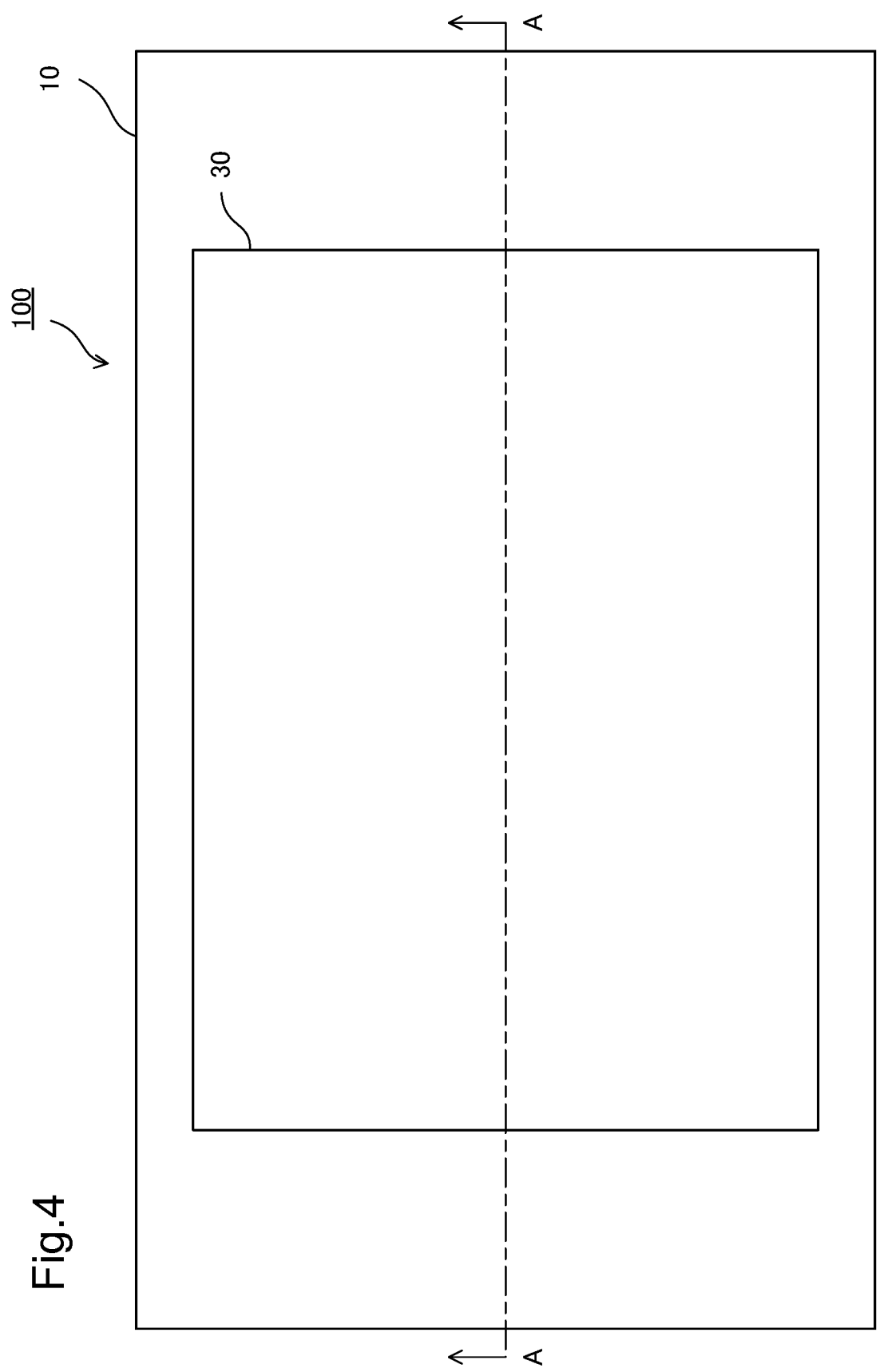
FIG. 4 is a top view illustrating the structure of the electronic apparatus according to the first example embodiment of the present invention.

FIG. 1 is a cross-sectional view illustrating a structure of the electronic apparatus 100 and illustrates a section at an A-A cutting plane in FIG. 4. FIG. 2 is a cross-sectional view illustrating the structure of the electronic apparatus 100 and illustrates a section at a B-B cutting plane in FIG. 3. FIG. 3 is a side view illustrating the structure of the electronic apparatus 100. FIG. 4 is a top view illustrating the structure of the electronic apparatus 100. FIG. 1 and FIG. 3 indicate a vertical direction G.

Referring to FIG. 1 to FIG. 4, the electronic apparatus 100 includes a circuit board 10, a heat-generating body 20, and an enclosure 30. For example, the electronic apparatus 100 can be used in an electronic module built into a communication device or a server. The circuit board 10 is not an essential component in the present example embodiment and may be omitted.

The circuit board 10 is formed in a flat plate shape. The circuit board 10 includes a first principal surface 11 and a second principal surface 12. A principal surface of the circuit board 10 refers to a primary surface of the circuit board 10 and, for example, refers to a surface on which an electronic part is mounted. The first principal surface 11 may also be referred to as a front surface of the circuit board, and the second principal surface 12 may also be referred to as a back surface of the circuit board. The heat-generating body 20 is mounted on the first principal surface 11 of the circuit board 10.

For example, the circuit board 10 is a printed wiring board. A printed wiring board is formed by laminating a plurality of insulating substrates and conductor wirings. Electroconductive pads for mounting electronic parts are formed on the first principal surface 11 and the second principal surface 12 of the circuit board 10. For example, glass epoxy resin is used as a material of an insulating substrate. For example, a conductor wiring and a pad are formed of copper foils.

The heat-generating body 20 is mounted on the first principal surface 11 of the circuit board 10. The heat-generating body 20 includes a first heat-generating body outer surface 21. The first heat-generating body outer surface 21 is one of outer surfaces of the heat-generating body 20 and is a surface of the heat-generating body 20 opposite to a surface on the circuit board 10 side. The first heat-generating body outer surface 21 is generally formed by a plane surface but may be formed by a curved surface. The heat-generating body 20 is a part generating heat when in operation and is, for example, a central processing unit (CPU) or a multi-chip module (MCM).

The enclosure 30 includes an opening 31. As illustrated in FIG. 1, an outer circumferential part of the first heat-generating body outer surface 21 is mounted on an outer circumferential part of the opening 31 in such a way that a coolant (hereinafter referred to as COO) is hermetically sealed between the enclosure 30 and the heat-generating body 20. As illustrated in FIG. 1, the inside of the enclosure 30 is a cavity. A coolant COO is provided in the cavity. For example, the outer circumferential part of the first heat-generating body outer surface 21 is mounted on the outer circumferential part of the opening 31 by fixing by use of an adhesive or a screw. Consequently, the outer circumferential part of the first heat-generating body outer surface 21 of the heat-generating body 20 is joined to the outer circumferential part of the opening 31 of the enclosure 30. At this time, the opening 31 of the enclosure 30 is hermetically sealed by the first heat-generating body outer surface 21 of the heat-generating body 20. Consequently, a coolant COO can be hermetically sealed in the cavity of the enclosure 30. A thermal conductive member is used as a material of the enclosure 30, and for example, aluminum, an aluminum alloy, copper, or a copper alloy is used.

An elastic member such as natural rubber or synthetic rubber may be placed between the outer circumferential part of the first heat-generating body outer surface 21 and the outer circumferential part of the opening 31. Consequently, a gap between the outer circumferential part of the first heat-generating body outer surface 21 and the outer circumferential part of the opening 31 can be further reduced. Consequently, a leak of the coolant COO out of the cavity of the enclosure 30 can be suppressed. More preferably, a thermal conductive member (such as thermal conductive silicon rubber) may be used as the aforementioned elastic member. Consequently, heat of the heat-generating body 20 can be more efficiently conducted from the outer circumferential part of the first heat-generating body outer surface 21 to the outer circumferential part of the opening 31.

A coolant undergoing a phase change between a coolant in a liquid phase (liquid-phase coolant: hereinafter referred to as LP-COO) and a coolant in a gas phase (gas-phase coolant: hereinafter referred to as GP-COO) is used as a coolant COO.

For example, hydrofluorocarbon (HFC) or hydrofluoroether (HFE) may be used as a coolant COO.

A coolant COO is trapped in a hermetically sealed state in a space in which the opening 31 of the enclosure 30 is hermetically sealed, by the first heat-generating body outer surface 21 of the heat-generating body 20. Consequently, by evacuating the enclosed space between the enclosure 30 and the heat-generating body 20 after injecting a liquid-phase coolant LP-COO, the inside of the enclosed space is always maintained at the saturated vapor pressure of the coolant. A method of filling the enclosed space between the enclosure 30 and the heat-generating body 20 with a coolant COO will be described in detail in a description of a manufacturing method of the electronic apparatus 100 to be described later.

The above concludes the description of the structure of the electronic apparatus 100.

Next, the manufacturing method of the electronic apparatus 100 will be described.

First, the heat-generating body 20 mounted on the circuit board 10 is prepared. Next, the enclosure 30 is mounted on the first heat-generating body outer surface 21 of the heat-generating body 20 by use of an adhesive, screwing, or the like. Consequently, the outer circumferential part of the first heat-generating body outer surface 21 of the heat-generating body 20 is joined to the outer circumferential part of the opening 31 of the enclosure 30. At this time, the opening 31 of the enclosure 30 is hermetically sealed by the first heat-generating body outer surface 21 of the heat-generating body 20. Then, the space between the enclosure 30 and the circuit board 10 is filled with a coolant COO.

A method of filling the space between the enclosure 30 and the heat-generating body 20 with a coolant COO is as follows.

A coolant COO is injected into the space between the enclosure 30 and the heat-generating body 20 from a coolant injection hole (unillustrated) previously provided on a side of the enclosure 30 (a surface on the right side or the left side on the page in FIG. 1). Then, the coolant injection hole is closed. The air is removed from the space between the enclosure 30 and the heat-generating body 20 through an air removal hole (unillustrated) previously provided on a side of the enclosure 30 (a surface on the right side or the left side on the page in FIG. 1) by use of a vacuum pump (unillustrated) or the like. Then, the air removal hole is closed. Thus, the coolant COO is hermetically sealed in the space between the enclosure 30 and the heat-generating body 20. Consequently, pressure inside the space between the enclosure 30 and the heat-generating body 20 becomes equal to the saturated vapor pressure of the coolant COO, and the boiling point of the coolant COO hermetically sealed in the space between the enclosure 30 and the heat-generating body 20 becomes around the room temperature. The coolant injection hole may also be used as the air removal hole.

The above concludes the description of the manufacturing method of the electronic apparatus 100.

Next, an operation of the electronic apparatus 100 will be described.

When the electronic apparatus 100 is started, power is supplied to the heat-generating body 20 on the circuit board 10. Consequently, the heat-generating body 20 generates heat.

The central part of the first heat-generating body outer surface 21 of the heat-generating body 20 is in contact with a liquid-phase coolant LP-COO in the enclosure 30. Consequently, the liquid-phase coolant LP-COO stored on the lower side of the enclosure 30 in the vertical direction G is boiled at the first heat-generating body outer surface 21 of the heat-generating body 20 by heat of the heat-generating body 20 and undergoes a phase change to a gas-phase coolant GP-COO. Consequently, gas bubbles of the gas-phase coolant GP-COO are generated. The heat-generating body 20 is cooled by evaporation heat (latent heat) generated by the phase change.

The gas-phase coolant GP-COO rises upward in the vertical direction G in the liquid-phase coolant LP-COO, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 20 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 20 again.

The outer circumferential part of the first heat-generating body outer surface 21 of the heat-generating body 20 is joined to the outer circumferential part of the opening 31 of the enclosure 30. Consequently, the heat of the heat-generating body 20 is transferred to the enclosure 30 through the joint between the outer circumferential part of the first heat-generating body outer surface 21 and the outer circumferential part of the opening 31. Consequently, the heat-generating body 20 is cooled.

The above concludes the description of the operation of the electronic apparatus 100.

As described above, the electronic apparatus 100 according to the first example embodiment of the present invention includes the heat-generating body 20 and the enclosure 30. The enclosure 30 includes the opening 31. The outer circumferential part of the first heat-generating body outer surface 21 being an outer surface of the heat-generating body 20 is mounted on the outer circumferential part of the opening 31 in such a way that a coolant COO is hermetically sealed between the enclosure 30 and the heat-generating body 20. The coolant COO is a coolant that can undergo a phase change to a liquid-phase coolant LP-COO and a gas-phase coolant GP-COO.

Thus, by mounting the outer circumferential part of the first heat-generating body outer surface 21 of the heat-generating body 20 on the outer circumferential part of the opening 31, the electronic apparatus 100 according to the first example embodiment of the present invention hermetically seals a coolant COO between the enclosure 30 and the heat-generating body 20.

Consequently, the heat-generating body 20 can directly come in contact with the coolant COO in the enclosure 30. Thus, heat of the heat-generating body 20 can be directly transferred to the coolant COO in the enclosure 30 bypassing a surface of the enclosure 30 on the heat-generating body 20 side (the bottom) and a gap between the bottom of the enclosure 30 and the heat-generating body 20. Consequently, the heat of the heat-generating body 20 can be more efficiently cooled.

As described above, in the technology described in PTL 1, the heat-generating body is mounted on the heat-receiving surface of the vapor chamber, and heat of the heat-generating body is transferred to a coolant through the case of the vapor chamber. At this time, a gap is generated between the heat-generating body and the case of the vapor chamber, and therefore the heat of the heat-generating body is not sufficiently transferred to the coolant. A temperature rise of the coolant in the vapor chamber is suppressed, a phase change of the coolant from a liquid phase to a gas phase is suppressed, and the heat of the heat-generating body cannot be sufficiently cooled.

On the other hand, as described above, the heat-generating body 20 can directly come in contact with a coolant COO in the enclosure 30 in the electronic apparatus 100 according to the first example embodiment of the present invention. Consequently, heat of the heat-generating body 20 can be directly transferred to the coolant COO in the enclosure 30 bypassing the surface of the enclosure 30 on the heat-generating body 20 side (the bottom) and the gap between the bottom of the enclosure 30 and the heat-generating body 20. Consequently, the electronic apparatus 100 according to the first example embodiment of the present invention can more efficiently cool the heat of the heat-generating body 20 compared with the invention described in Reference 1.

In a technology described in PTL 2, an electronic circuit package includes at least a heat-generating part, a cover is provided in such a way that a hermetically sealed container is formed with a part-mounting surface of the package as part of a wall, and the entire heat-generating part is immersed by putting a cooling fluid into the cover.

In a technology described in PTL 3, a heat-generating body (heat-generating electronic device 510) is mounted on a circuit board (printed circuit board 540). An enclosure (a module casing 530 and an uppermost wall 571 of a housing) is mounted on one surface of the circuit board in such a way as to accommodate the heat-generating body and hermetically seal a coolant (dielectric coolant 532) between the enclosure and the one surface of the circuit board. Two pumps (impingement-cooling immersed pumps 535 and 536) are placed in the coolant in the enclosure and circulate the coolant. A cooling structure (liquid-cooled cold plate 420) is mounted on an upper surface of the enclosure (the uppermost wall 571 of the housing). A coolant different from the coolant in the enclosure flows from an inlet to an outlet in the cooling structure. Thus, the technology described in PTL 2 cools heat of the heat-generating body by circulating a coolant in the enclosure and causing a coolant different from the coolant in the enclosure to flow in the cooling structure.

Thus, in the technologies described in PTLs 2 and 3, an entire heat-generating body is immersed in a coolant in an enclosure.

On the other hand, in the electronic apparatus 100 according to the first example embodiment of the present invention, the outer circumferential part of the first heat-generating body outer surface 21 of the heat-generating body 20 is mounted on the outer circumferential part of the opening 31, and therefore only the first heat-generating body outer surface 21 of the heat-generating body 20 comes in contact with a coolant in the enclosure 30. In other words, the entire heat-generating body 20 is not immersed in the coolant in the enclosure 30.

Thus, the electronic apparatus 100 according to the first example embodiment of the present invention is formed in such a way that only part of the surfaces of the heat-generating body 20 comes in contact with the coolant in the enclosure 30 and therefore can reduce an amount of coolant compared with the technologies described in PTLs 2 and 3.

Further, in the electronic apparatus 100 according to the first example embodiment of the present invention, the entire heat-generating body does not need to be immersed in a coolant COO. Consequently, in the electronic apparatus 100, the heat-generating body 20 can be more easily removed from the circuit board 10 during replacement work of the heat-generating body 20 or the like compared with the technology described in Reference 1.

Further, in the electronic apparatus 100 according to the first example embodiment of the present invention, the heat-generating body 20 is mounted on the circuit board 10. The first heat-generating body outer surface 21 is a surface of the heat-generating body 20 opposite to the surface on the circuit board 10 side.

Consequently, the heat-generating body 20 on which the enclosure 30 is mounted can be retained by the circuit board 10. Further, heat of the heat-generating body 20 can be transferred to the circuit board 10. Consequently, the heat of the heat-generating body 20 can be more efficiently cooled.

First Modified Example of First Example Embodiment

A structure of an electronic apparatus 100A being a first modified example of the electronic apparatus according to the first example embodiment of the present invention will be described based on drawings.

Figure 5:
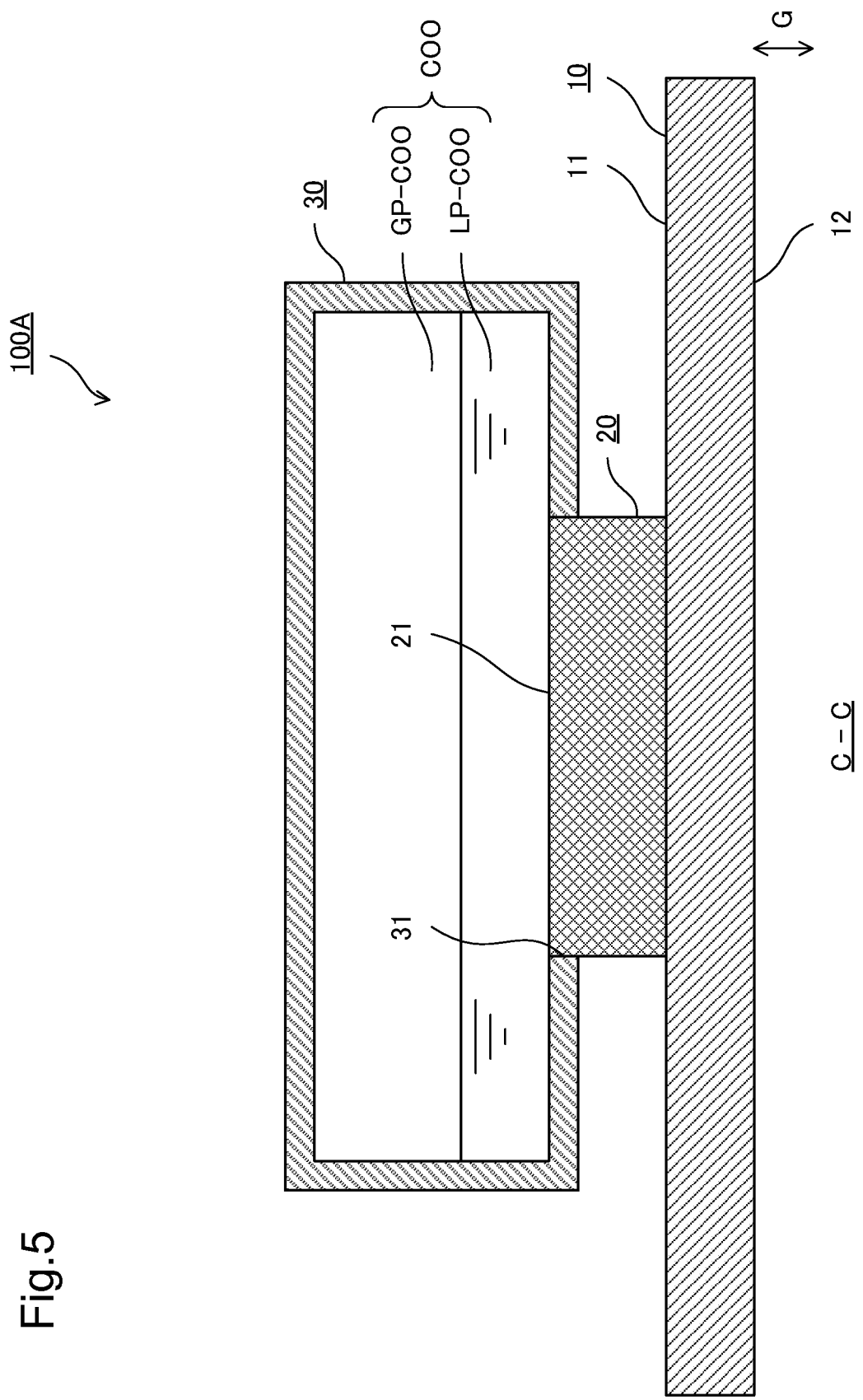
FIG. 5 is a cross-sectional view illustrating a structure of a first modified example of the electronic apparatus according to the first example embodiment of the present invention and illustrates a section at a C-C cutting plane in FIG. 8.
Figure 6:
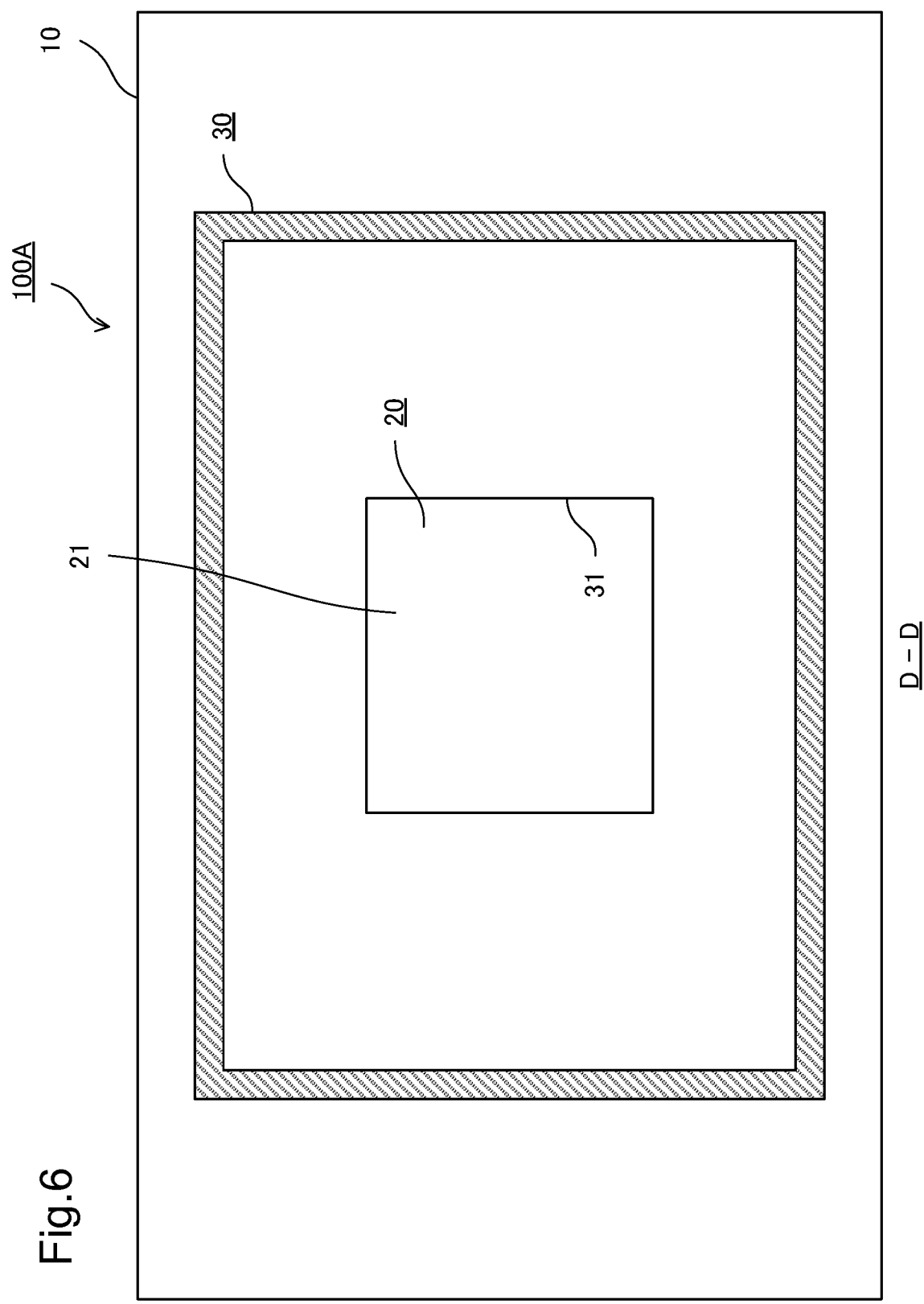
FIG. 6 is a cross-sectional view illustrating the structure of the first modified example of the electronic apparatus according to the first example embodiment of the present invention and illustrates a section at a D-D cutting plane in FIG. 7.
Figure 7:
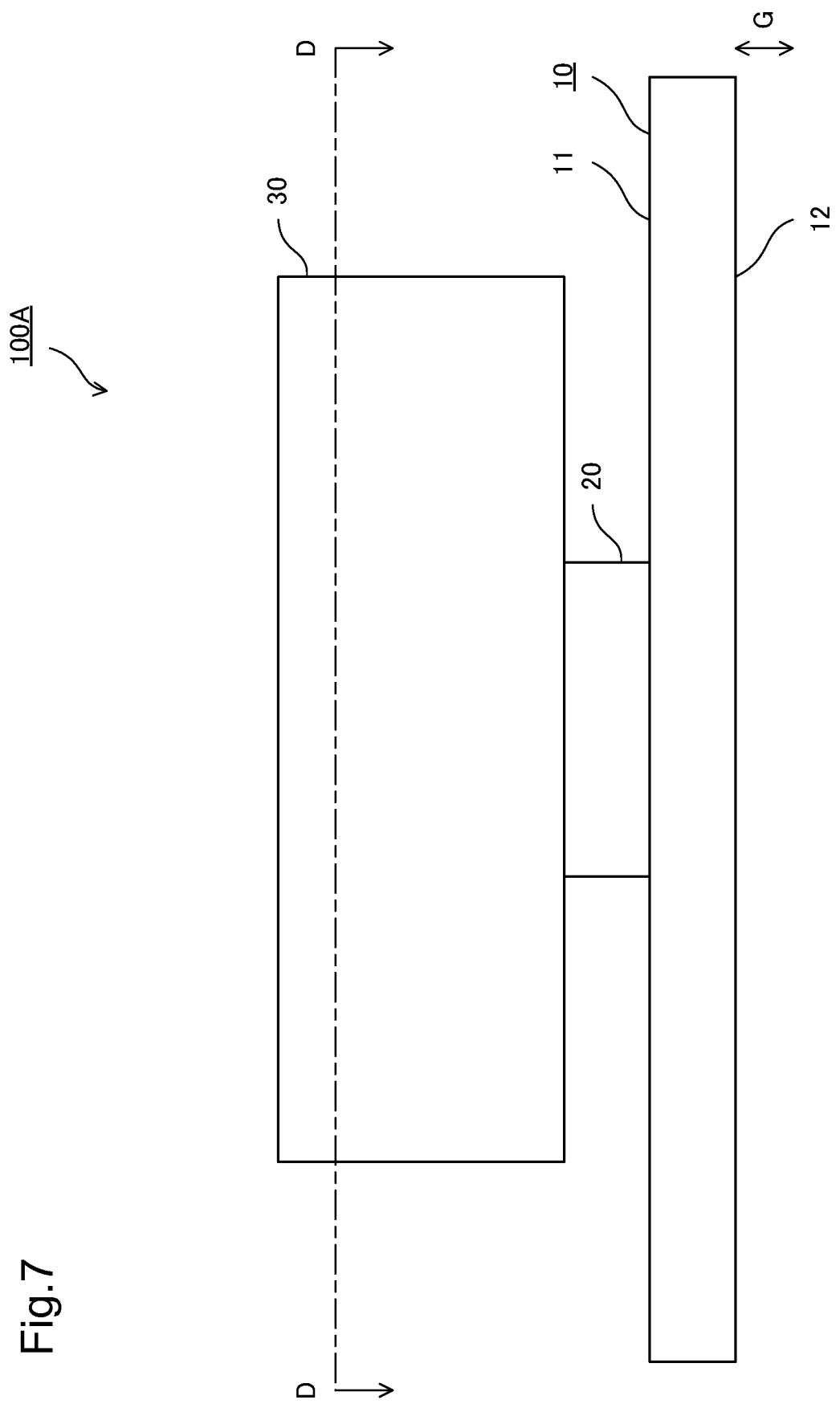
FIG. 7 is a side view illustrating the structure of the first modified example of the electronic apparatus according to the first example embodiment of the present invention.
Figure 8:
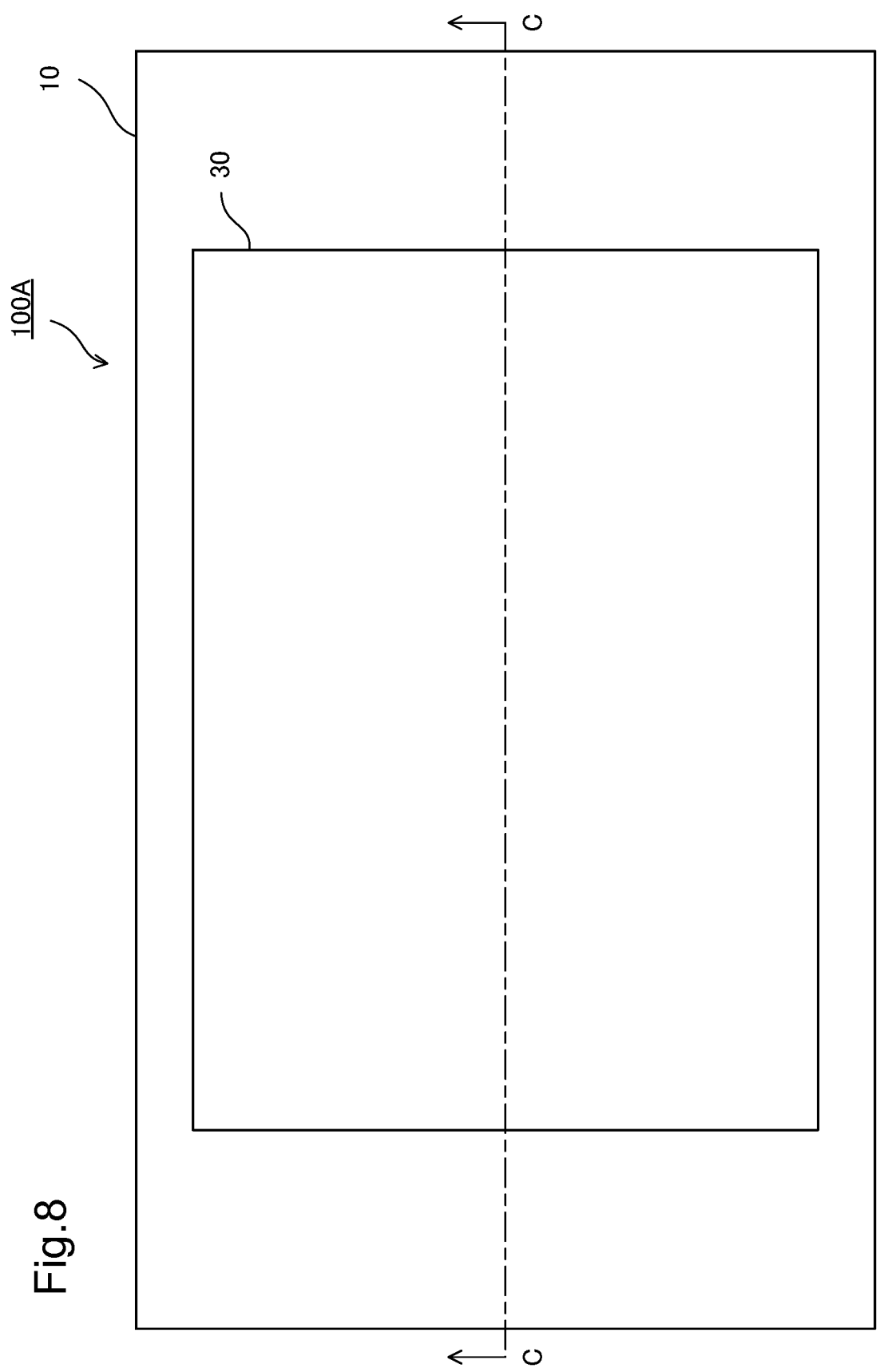
FIG. 8 is a top view illustrating the structure of the first modified example of the electronic apparatus according to the first example embodiment of the present invention.

FIG. 5 is a cross-sectional view illustrating a structure of the electronic apparatus 100A and illustrates a section at a C-C cutting plane in FIG. 8. FIG. 6 is a cross-sectional view illustrating the structure of the electronic apparatus 100A and illustrates a section at a D-D cutting plane in FIG. 7. FIG. 7 is a side view illustrating the structure of the electronic apparatus 100A. FIG. 8 is a top view illustrating the structure of the electronic apparatus 100A.

FIG. 5 and FIG. 7 indicate a vertical direction G. In FIG. 5 to FIG. 8, a component equivalent to each component illustrated in FIG. 1 to FIG. 4 is given a sign equivalent to the sign indicated in FIG. 1 to FIG. 4.

Referring to FIG. 5 to FIG. 8, the electronic apparatus 100A includes a circuit board 10, a heat-generating body 20, and an enclosure 30. For example, the electronic apparatus 100A can be used in an electronic module built into a communication device or a server. The circuit board 10 is not an essential component in the present example embodiment and may be omitted.

The electronic apparatus 100A will be compared with the electronic apparatus 100. In the electronic apparatus 100, the outer circumferential part of the first heat-generating body outer surface 21 is mounted on the outer circumferential part of the opening 31 in such a way that a coolant COO is hermetically sealed between the enclosure 30 and the heat-generating body 20. On the other hand, in the electronic apparatus 100A, an outer circumferential part of a first heat-generating body outer surface 21 is mounted on an inner circumferential part of an opening 31 in such a way that a coolant COO is hermetically sealed between the enclosure 30 and the heat-generating body 20. The two differ from each other in this respect.

Specifically, the enclosure 30 includes the opening 31. As illustrated in FIG. 5, the outer circumferential part of the first heat-generating body outer surface 21 is mounted on the inner circumferential part of the opening 31 in such a way that a coolant COO is hermetically sealed between the enclosure 30 and the heat-generating body 20. As illustrated in FIG. 5, the inside of the enclosure 30 is a cavity. A coolant COO is provided in the cavity. For example, the outer circumferential part of the first heat-generating body outer surface 21 is mounted on the inner circumferential part of the opening 31 by fixing by use of an adhesive or a screw. Consequently, the outer circumferential part of the first heat-generating body outer surface 21 of the heat-generating body 20 is joined to the inner circumferential part of the opening 31 of the enclosure 30. At this time, the opening 31 of the enclosure 30 is hermetically sealed by the first heat-generating body outer surface 21 of the heat-generating body 20. Consequently, a coolant COO can be hermetically sealed in the cavity of the enclosure 30.

An elastic member such as natural rubber or synthetic rubber may be placed between the outer circumferential part of the first heat-generating body outer surface 21 and the inner circumferential part of the opening 31. Consequently, a gap between the outer circumferential part of the first heat-generating body outer surface 21 and the inner circumferential part of the opening 31 can be further reduced. Consequently, a leak of the coolant COO out of the cavity of the enclosure 30 can be suppressed. More preferably, a thermal conductive member (such as thermal conductive silicon rubber) may be used as the aforementioned elastic member. Consequently, heat of the heat-generating body 20 can be more efficiently conducted from the outer circumferential part of the first heat-generating body outer surface 21 to the inner circumferential part of the opening 31.

The above concludes the description of the structure of the electronic apparatus 100A.

Next, a manufacturing method of the electronic apparatus 100A will be described.

First, the heat-generating body 20 mounted on the circuit board 10 is prepared. Next, the enclosure 30 is mounted on the first heat-generating body outer surface 21 of the heat-generating body 20 by use of an adhesive, screwing, or the like. Consequently, the outer circumferential part of the first heat-generating body outer surface 21 of the heat-generating body 20 is joined to the inner circumferential part of the opening 31 of the enclosure 30. At this time, the opening 31 of the enclosure 30 is hermetically sealed by the first heat-generating body outer surface 21 of the heat-generating body 20. Then, the space between the enclosure 30 and the circuit board 10 is filled with a coolant COO.

A method of filling the space between the enclosure 30 and the heat-generating body 20 with a coolant COO is as described in the first example embodiment.

The above concludes the description of the manufacturing method of the electronic apparatus 100A.

Next, an operation of the electronic apparatus 100A will be described.

When the electronic apparatus 100A is started, power is supplied to the heat-generating body 20 on the circuit board 10. Consequently, the heat-generating body 20 generates heat.

The first heat-generating body outer surface 21 of the heat-generating body 20 is in contact with a liquid-phase coolant LP-COO in the enclosure 30. Consequently, the liquid-phase coolant LP-COO stored on the lower side of the enclosure 30 in the vertical direction G is boiled at the first heat-generating body outer surface 21 of the heat-generating body 20 by heat of the heat-generating body 20 and undergoes a phase change to a gas-phase coolant GP-COO. Consequently, gas bubbles of the gas-phase coolant GP-COO are generated. The heat-generating body 20 is cooled by evaporation heat (latent heat) generated by the phase change.

The gas-phase coolant GP-COO rises upward in the vertical direction G in the liquid-phase coolant LP-COO, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 20 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 20 again.

The outer circumferential part of the first heat-generating body outer surface 21 of the heat-generating body 20 is joined to the inner circumferential part of the opening 31 of the enclosure 30. Consequently, the heat of the heat-generating body 20 is transferred to the enclosure 30 through the joint between the outer circumferential part of the first heat-generating body outer surface 21 and the inner circumferential part of the opening 31. Consequently, the heat-generating body 20 is cooled.

The above concludes the description of the operation of the electronic apparatus 100A.

As described above, the electronic apparatus 100A being the first modified example of the electronic apparatus according to the first example embodiment of the present invention includes the heat-generating body 20 and the enclosure 30. The enclosure 30 includes the opening 31. The outer circumferential part of the first heat-generating body outer surface 21 being an outer surface of the heat-generating body 20 is mounted on the inner circumferential part of the opening 31 in such a way that a coolant COO is hermetically sealed between the enclosure 30 and the heat-generating body 20. The coolant COO is a coolant that can undergo a phase change to a liquid-phase coolant LP-COO and a gas-phase coolant GP-COO.

Such a structure can also provide an effect similar to that of the electronic apparatus 100.

Second Modified Example of First Example Embodiment

A structure of an electronic apparatus 100B being a second modified example of the electronic apparatus according to the first example embodiment of the present invention will be described based on a drawing.

Figure 9:
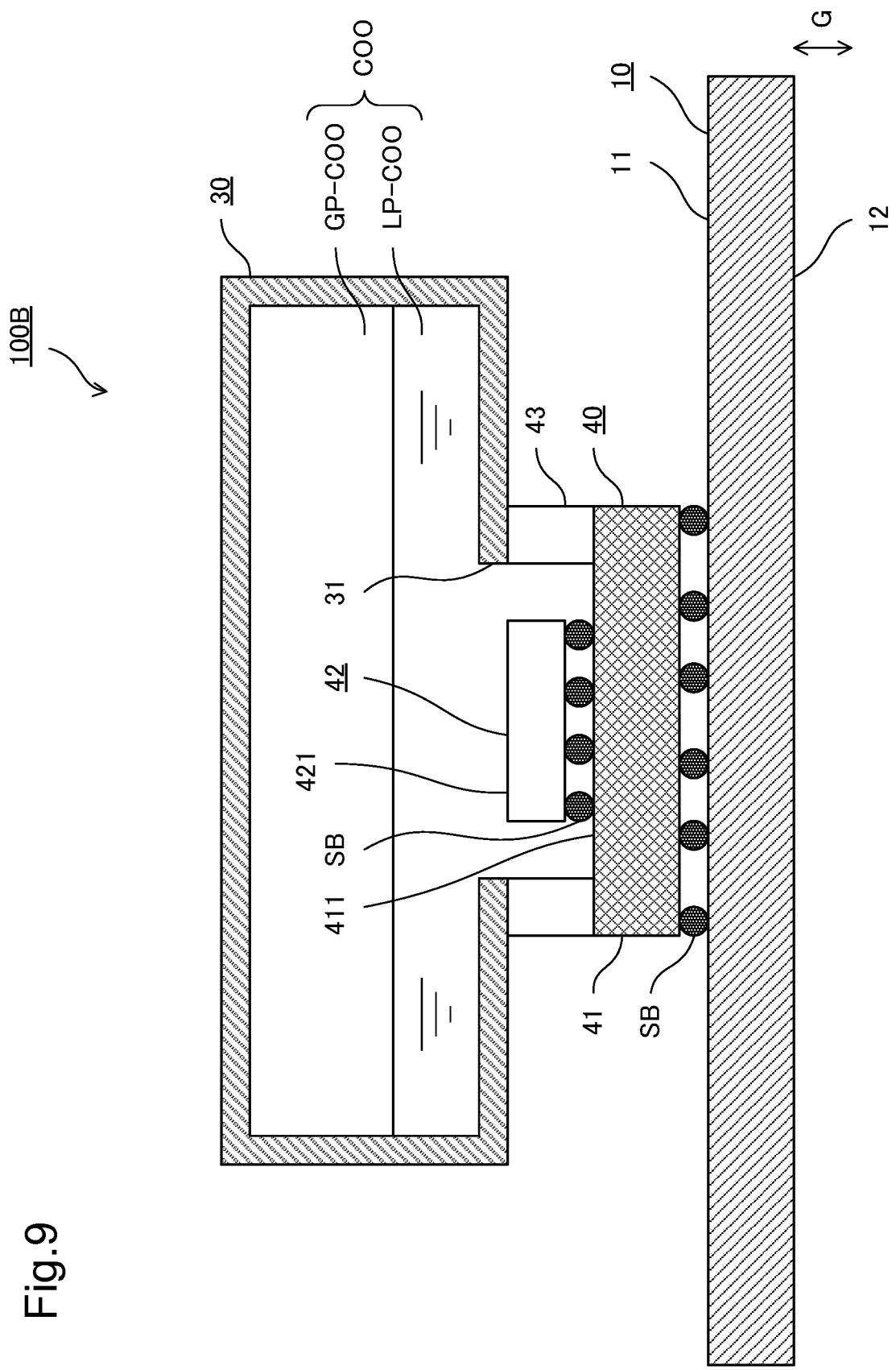
FIG. 9 is a cross-sectional view illustrating a structure of a second modified example of the electronic apparatus according to the first example embodiment of the present invention.

FIG. 9 is a cross-sectional view illustrating the structure of the electronic apparatus 100B. FIG. 9 is a cross-sectional view relating to FIG. 1. FIG. 9 indicates a vertical direction G. In FIG. 9, a component equivalent to each component illustrated in FIG. 1 to FIG. 8 is given a sign equivalent to the sign indicated in FIG. 1 to FIG. 8.

Referring to FIG. 9, the electronic apparatus 100B includes a circuit board 10, a heat-generating body 40, and an enclosure 30. For example, the electronic apparatus 100B can be used in an electronic module built into a communication device or a server. The circuit board 10 is not an essential component in the present example embodiment and may be omitted.

The electronic apparatus 100B will be compared with the electronic apparatus 100. In the electronic apparatus 100 and the electronic apparatus 100B, each of the heat-generating body 20 and the heat-generating body 40 is a part generating heat when in operation and is, for example, a central processing unit (CPU) or a multi-chip module (MCM). There is a commonality between the two in this respect. On the other hand, the electronic apparatus 100B differs from the electronic apparatus 100 the heat-generating body 20 of which is formed by an ordinary package, in that the heat-generating body 40 is formed by a ball grid array (BGA) type integrated circuit (IC) package.

Specifically, as illustrated in FIG. 9, the heat-generating body 40 includes a base 41, a die 42, and a support 43.

The base 41 is connected to the first principal surface 11 of the circuit board 10 by solder balls (hereinafter referred to as SB). Consequently, the base 41 is electrically and thermally connected to the circuit board 10.

The base 41 includes an upper surface 411. The die 42 is mounted on the central part of the upper surface 411. At this time, the upper surface 411 is connected to the die 42 by the solder balls SB. Consequently, the base 41 is electrically and thermally connected to the die 42. The support 43 is mounted on an outer circumferential part of the upper surface 411 by, for example an adhesive. The upper surface 411 corresponds to the first heat-generating body outer surface of the heat-generating body 40.

The die 42 includes an upper surface 421. The die 42 is connected to the central part of the upper surface 411 of the base 41 by the solder balls SB. Consequently, the base 41 is electrically and thermally connected to the die 42.

The support 43 is placed on the outer circumferential part of the upper surface 411 of the base 41 in such a way as to surround the die 42. The support 43 is mounted on the outer circumferential part of the upper surface 411 by, for example, an adhesive. Further, the support 43 is mounted on the outer circumferential part of an opening 31 by, for example, an adhesive. Consequently, the outer circumferential part of the upper surface 411 is connected to the outer circumferential part of the opening 31 by the support 43.

As illustrated in FIG. 9, the outer circumferential part of the upper surface 411 (first heat-generating body outer surface) of the base 41 is mounted on an inner circumferential part of the opening 31 of the enclosure 30 through the support 43 in such a way that a coolant COO is hermetically sealed between the enclosure 30 and the heat-generating body 40.

The above concludes the description of the structure of the electronic apparatus 100B.

Next, a manufacturing method of the electronic apparatus 100B will be described.

First, the heat-generating body 40 mounted on the circuit board 10 is prepared. Next, the enclosure 30 is mounted on the upper surface 411 (first heat-generating body outer surface) of the base 41 of the heat-generating body 40 by use of an adhesive, screwing, or the like. Consequently, the outer circumferential part of the upper surface 411 (first heat-generating body outer surface) of the base 41 of the heat-generating body 40 is joined to an outer circumferential part of the opening 31 of the enclosure 30. At this time, the opening 31 of the enclosure 30 is hermetically sealed by the upper surface 411 (first heat-generating body outer surface) of the base 41 of the heat-generating body 40. Then, the space between the enclosure 30 and the circuit board 10 is filled with a coolant COO.

A method of filling the space between the enclosure 30 and the heat-generating body 40 with a coolant COO is as described in the first example embodiment.

The above concludes the description of the manufacturing method of the electronic apparatus 100B.

Next, an operation of the electronic apparatus 100B will be described.

When the electronic apparatus 100B is started, power is supplied to the heat-generating body 40 on the circuit board 10. Consequently, the heat-generating body 40 generates heat.

The upper surface 411 (first heat-generating body outer surface) of the base 41 and the upper surface 421 of the die 42 in the heat-generating body 40 are in contact with a liquid-phase coolant LP-COO in the enclosure 30. Consequently, the liquid-phase coolant LP-COO stored on the lower side of the enclosure 30 in the vertical direction G is boiled at the upper surface 411 of the base 41 and the upper surface 421 of the die 42 by heat of the heat-generating body 40 and undergoes a phase change to a gas-phase coolant GP-COO. Consequently, gas bubbles of the gas-phase coolant GP-COO are generated. The heat-generating body 40 is cooled by evaporation heat (latent heat) generated by the phase change.

The gas-phase coolant GP-COO rises upward in the vertical direction G in the liquid-phase coolant LP-COO, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 40 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 40 again.

Further, the outer circumferential part of the upper surface 411 (first heat-generating body outer surface) of the base 41 of the heat-generating body 40 is joined to the outer circumferential part of the opening 31 of the enclosure 30 through the support 43. Consequently, the heat of the heat-generating body 40 is transferred to the enclosure 30 through the support 43 and the joint between the outer circumferential part of the upper surface 411 of the base 41 and the outer circumferential part of the opening 31. Consequently, the heat-generating body 40 is cooled.

The above concludes the description of the operation of the electronic apparatus 100B.

As described above, in the electronic apparatus 100B being the second modified example of the electronic apparatus according to the first example embodiment of the present invention, the heat-generating body 40 is formed by a BGA-type IC package. Such a structure can also provide an effect similar to that of the electronic apparatus 100.

Third Modified Example of First Example Embodiment

A structure of an electronic apparatus 100C being a third modified example of the electronic apparatus according to the first example embodiment of the present invention will be described based on a drawing.

Figure 10:
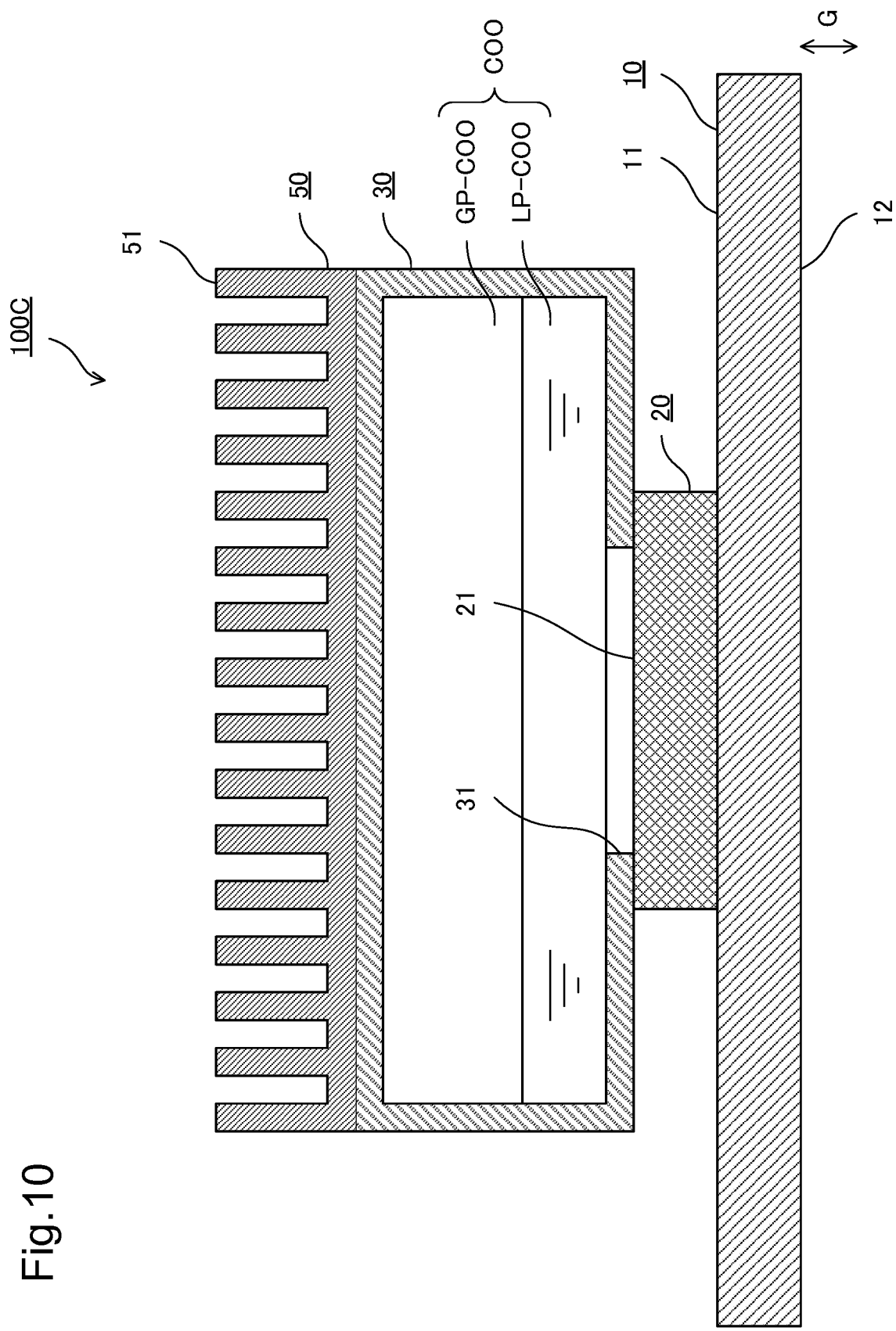
FIG. 10 is a cross-sectional view illustrating a structure of a third modified example of the electronic apparatus according to the first example embodiment of the present invention.

FIG. 10 is a cross-sectional view illustrating the structure of the electronic apparatus 100C. FIG. 10 indicates a vertical direction G. In FIG. 10, a component equivalent to each component illustrated in FIG. 1 to FIG. 9 is given a sign equivalent to the sign indicated in FIG. 1 to FIG. 9.

Referring to FIG. 10, the electronic apparatus 100C includes a circuit board 10, a heat-generating body 20, an enclosure 30, and a heat radiation part 50. For example, the electronic apparatus 100C can be used in an electronic module built into a communication device or a server. The circuit board 10 and the heat radiation part 50 are not essential components in the present example embodiment and may be omitted.

The electronic apparatus 100 will be compared with the electronic apparatus 100C. As illustrated in FIG. 10, the electronic apparatus 100C differs from the electronic apparatus 100 in further including the heat radiation part 50.

Referring to FIG. 10, the heat radiation part 50 is mounted on the upper surface (a surface on the upper part on the page in FIG. 10) of the enclosure 30. At this time, for example, the heat radiation part 50 is mounted on the enclosure 30 by use of adhesion by an adhesive, or screwing. The heat radiation part 50 may be integrally formed with the enclosure 30.

The heat radiation part 50 includes a plurality of radiator fins 51. The radiator fin 51 is formed in a flat plate shape. As illustrated in FIG. 10, the radiator fin 51 is formed in such a way as to extend along the vertical direction G. The extending direction of the radiator fin 51 is not limited to the vertical direction G. A thermal conductive member such as aluminum or an aluminum alloy is used as a material of the heat radiation part 50.

As described above, the electronic apparatus 100C being the third modified example of the first example embodiment further includes the heat radiation part 50. The heat radiation part 50 is mounted on the enclosure 30. The heat radiation part 50 radiates, out of the enclosure 30, heat of the heat-generating body 20 received through a coolant COO.

Consequently, the heat of the heat-generating body 20 can be radiated to the outside air at the heat radiation part 50 in addition to the enclosure 30. Consequently, the heat of the heat-generating body 20 can be yet more efficiently radiated compared with the electronic apparatus 100.

Fourth Modified Example of First Example Embodiment

A structure of an electronic apparatus 100D being a third modified example of the electronic apparatus according to the first example embodiment of the present invention will be described based on a drawing.

Figure 11:
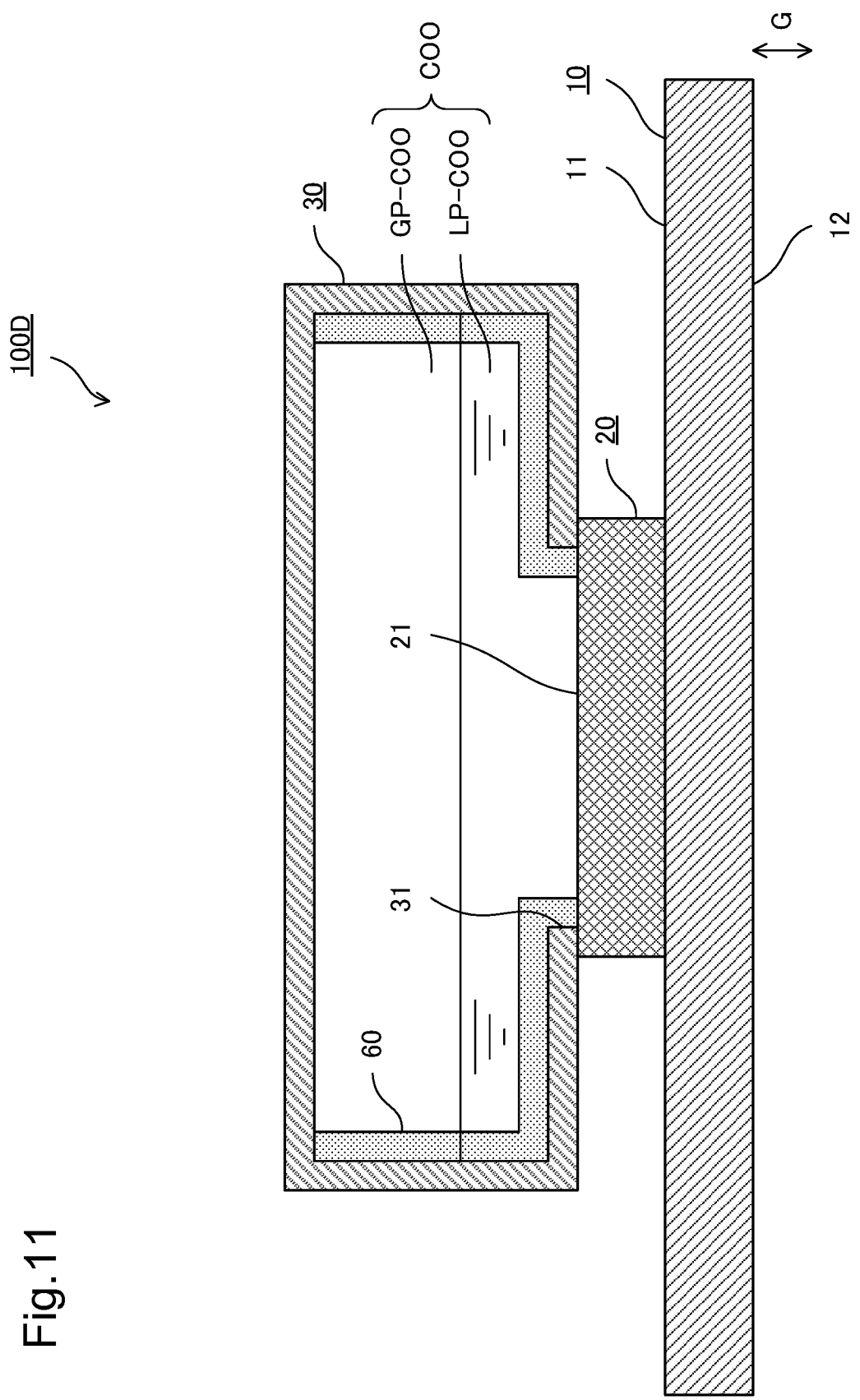
FIG. 11 is a cross-sectional view illustrating a structure of a fourth modified example of the electronic apparatus according to the first example embodiment of the present invention.

FIG. 11 is a cross-sectional view illustrating the structure of the electronic apparatus 100D. FIG. 11 indicates a vertical direction G. In FIG. 11, a component equivalent to each component illustrated in FIG. 1 to FIG. 10 is given a sign equivalent to the sign indicated in FIG. 1 to FIG. 10.

Referring to FIG. 11, the electronic apparatus 100D includes a circuit board 10, a heat-generating body 20, an enclosure 30, and a first coolant passage 60. For example, the electronic apparatus 100D can be used in an electronic module built into a communication device or a server. The circuit board 10 is not an essential component in the present example embodiment and may be omitted.

The electronic apparatus 100 will be compared with the electronic apparatus 100D. As illustrated in FIG. 11, the electronic apparatus 100D differs from the electronic apparatus 100 in further including the first coolant passage 60.

Referring to FIG. 11, the first coolant passage 60 is formed on the inner surface of the enclosure 30 at the bottom (a surface on the lower side on the page in FIG. 11) and the sides (a surface on the left side and a surface on the right side on the page in FIG. 11). The lower end of the first coolant passage 60 is an opening 31 of the enclosure 30. The upper end of the first coolant passage 60 is set above a surface of a liquid-phase coolant LP-COO in the enclosure 30 in the vertical direction G at the minimum amount of the liquid-phase coolant LP-COO. Accordingly, while the upper end of the first coolant passage 60 is set within the sides of the enclosure 30 in the example in FIG. 11, the upper end of the first coolant passage 60 may be set at the bottom of the enclosure 30. In other words, the first coolant passage 60 has only to be provided on the inner surface of the enclosure 30 from at least a periphery of the opening 31 up to above a surface of the liquid-phase coolant LP-COO in the vertical direction G.

The first coolant passage 60 is formed in such a way that a liquid-phase coolant LP-COO in the enclosure 30 flows toward the heat-generating body 20. For example, the first coolant passage 60 is formed of a porous body or minute grooves guiding the liquid-phase coolant LP-COO to the heat-generating body 20 by a capillary phenomenon. A capillary phenomenon is a physical phenomenon by which liquid inside a fine tubular body (capillary) rises (in some cases falls) in the tube. The phenomenon is also referred to as a capillary tube phenomenon.

For example, a porous body is a sintered body or a mesh. A sintered body is a body acquired by compressing an aggregate of solid powders in which a plurality of minute holes are formed between the solid powders by coupling of particles of the solid powders. The sintered body is formed by sintering solid powders on the inner surface of the enclosure 30. Sintering refers to compression of solid powders by heating an aggregate of the solid powders at a temperature lower than the melting point of the solid powders. For example, a mesh is formed of a metal sheet including a network.

For example, ceramic, aluminum, stainless steel, copper, brass, or bronze is used as a material of a sintered body. For example, alumina, yttria (yttrium oxide), aluminum nitride, boron nitride, silicon carbide, or silicon nitride is used as a main ingredient of ceramic. For example, metal such as aluminum, an aluminum alloy, copper, or a copper alloy is used as a material of a mesh.

Minute grooves is formed in such a way as to tend outward around the heat-generating body 20. The grooves can be formed by cutting the inner surface of the enclosure 30 or mounting a minute protruding member on the inner surface of the enclosure 30.

The porous body and the minute grooves may be formed across the entire surface of the bottom and the sides of the enclosure 30 or may be partially formed.

The above concludes the description of the structure of the electronic apparatus 100D.

Next, a manufacturing method of the electronic apparatus 100D will be described. While the manufacturing method differs from the manufacturing method of the electronic apparatus 100 according to the first example embodiment in preparing the enclosure 30 formed with the first coolant passage 60, the remaining processes are similar to those in the manufacturing method of the electronic apparatus 100 according to the first example embodiment.

The above concludes the description of the manufacturing method of the electronic apparatus 100D.

Next, an operation of the electronic apparatus 100D will be described.

When the electronic apparatus 100D is started, power is supplied to the heat-generating body 20 on the circuit board 10. Consequently, the heat-generating body 20 generates heat.

The central part of a first heat-generating body outer surface 21 of the heat-generating body 20 is in contact with a liquid-phase coolant LP-COO in the enclosure 30. Consequently, the liquid-phase coolant LP-COO stored on the lower side of the enclosure 30 in the vertical direction G is boiled at the first heat-generating body outer surface 21 of the heat-generating body 20 by heat of the heat-generating body 20 and undergoes a phase change to a gas-phase coolant GP-COO. Consequently, gas bubbles of the gas-phase coolant GP-COO are generated. The heat-generating body 20 is cooled by evaporation heat (latent heat) generated by the phase change.

The gas-phase coolant GP-COO rises upward in the vertical direction G in the liquid-phase coolant LP-COO, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 20 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 20 again.

At this time, the liquid-phase coolant LP-COO flows in the first coolant passage 60 toward the heat-generating body 20. The liquid-phase coolant LP-COO is guided to the heat-generating body 20 particularly by a capillary phenomenon in the first coolant passage 60.

An outer circumferential part of the first heat-generating body outer surface 21 of the heat-generating body 20 is joined to an outer circumferential part of the opening 31 of the enclosure 30. Consequently, heat of the heat-generating body 20 is transferred to the enclosure 30 through the joint between the outer circumferential part of the first heat-generating body outer surface 21 and the outer circumferential part of the opening 31. Consequently, the heat-generating body 20 is cooled.

The above concludes the description of the operation of the electronic apparatus 100D.

As described above, the electronic apparatus 100D being the fourth modified example of the first example embodiment further includes the first coolant passage 60. The first coolant passage 60 is provided on the inner surface of the enclosure 30 from at least a periphery of the opening 31 up to above the surface of a liquid-phase coolant LP-COO in the vertical direction G. The first coolant passage 60 is formed in such a way that the liquid-phase coolant LP-COO flows toward the heat-generating body 20.

Thus, the first coolant passage 60 is provided on the inner surface of the enclosure 30 from at least a periphery of the opening 31 up to above the surface of the liquid-phase coolant LP-COO in the vertical direction G. The first coolant passage 60 is formed in such a way that the liquid-phase coolant LP-COO flows toward the heat-generating body 20. Consequently, the liquid-phase coolant LP-COO generated on the upper side of the enclosure 30 in the vertical direction G flows toward the heat-generating body 20 through the first coolant passage 60. Accordingly, the liquid-phase coolant LP-COO can be more rapidly and smoothly supplied to the heat-generating body 20. Consequently, heat of the heat-generating body 20 can be more efficiently cooled compared with a case of not providing the first coolant passage 60.

Further, in the electronic apparatus 100D being the fourth modified example of the first example embodiment, the first coolant passage 60 guides the liquid-phase coolant LP-COO by a capillary phenomenon. Thus, the liquid-phase coolant LP-COO can be guided to the heat-generating body 20 by use of a capillary phenomenon, and therefore the liquid-phase coolant LP-COO can be more rapidly and smoothly supplied to the heat-generating body 20. Consequently, the heat of the heat-generating body 20 can be yet more efficiently cooled compared with the case of not providing the first coolant passage 60. Further, the first coolant passage 60 guides the liquid-phase coolant LP-COO by a capillary phenomenon and therefore can guide the liquid-phase coolant LP-COO to the heat-generating body 20 against gravity even when the electronic apparatus 100D is placed upside down or the electronic apparatus 100D is vertically placed in FIG. 11. For example, the case of the electronic apparatus 100D vertically placed refers to a case of a first principal surface 11 of the circuit board 10 being placed in parallel with the vertical direction G.

Further, in the electronic apparatus 100D being the fourth modified example of the first example embodiment, the first coolant passage 60 is formed by grooves or a porous body. Consequently, the first coolant passage 60 generating a capillary phenomenon can be easily formed.

While an embodiment in which the first coolant passage 60 is added to the electronic apparatus 100 has been described in the fourth modified example of first example embodiment, the first coolant passage 60 may also be added to the electronic apparatuses 100A to 100C.

Second Example Embodiment

A structure of an electronic apparatus 100E according to a second example embodiment of the present invention will be described based on drawings.

Figure 12:
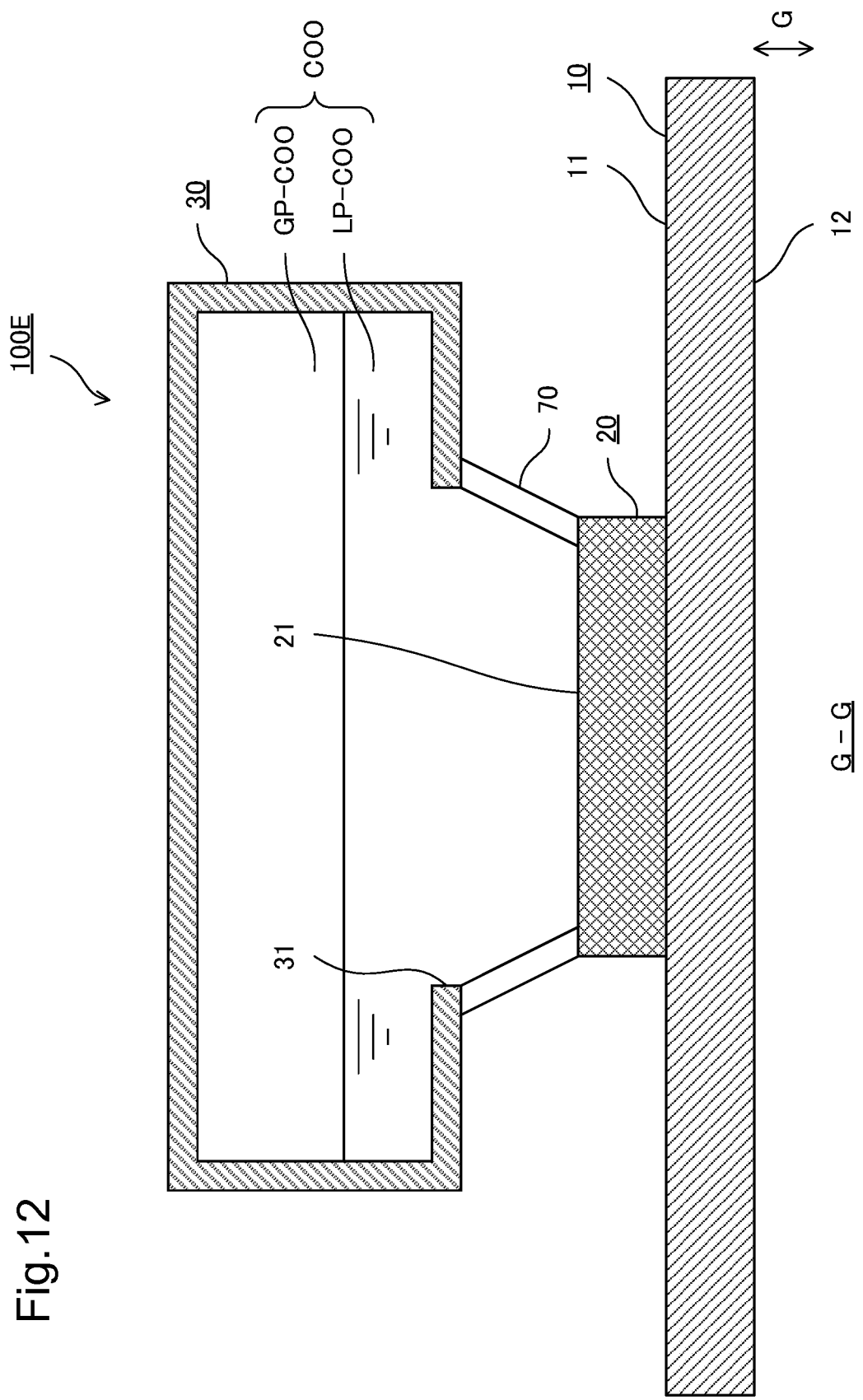
FIG. 12 is a cross-sectional view illustrating a structure of an electronic apparatus according to a second example embodiment of the present invention and illustrates a section at a G-G cutting plane in FIG. 15.
Figure 13:
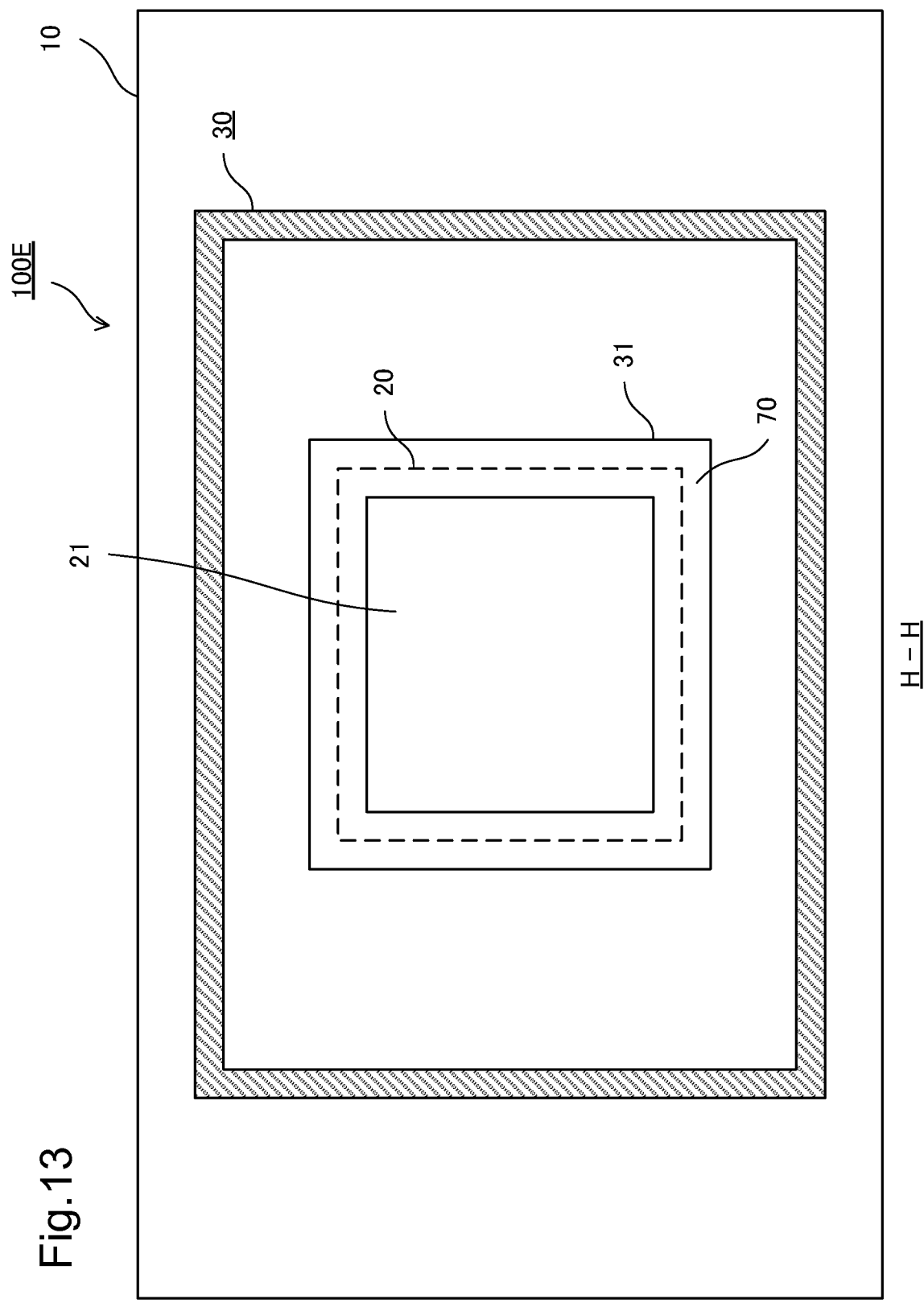
FIG. 13 is a cross-sectional view illustrating the structure of the electronic apparatus according to the second example embodiment of the present invention and illustrates a section at an H-H cutting plane in FIG. 14.
Figure 14:
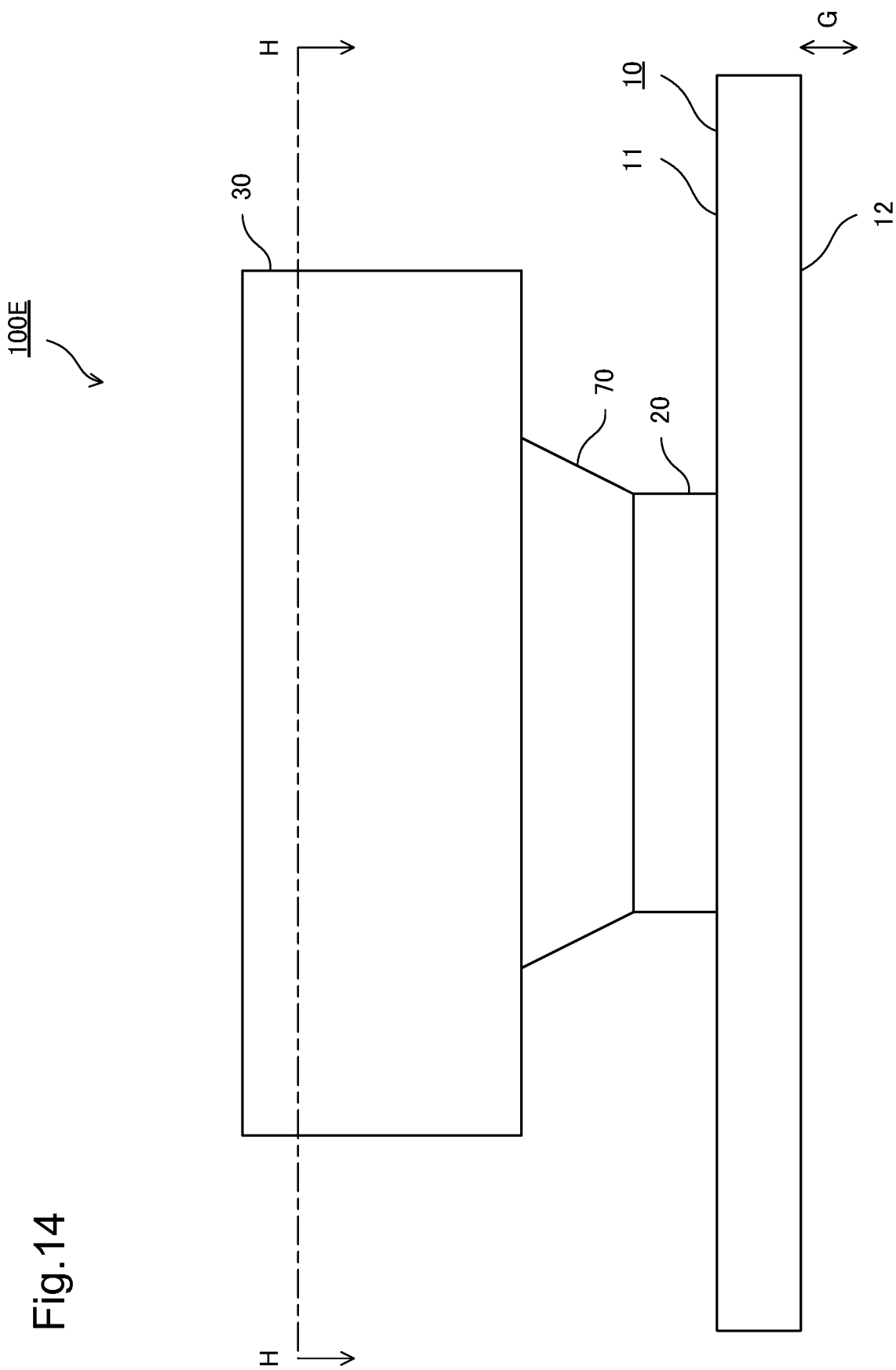
FIG. 14 is a side view illustrating the structure of the electronic apparatus according to the second example embodiment of the present invention.
Figure 15:
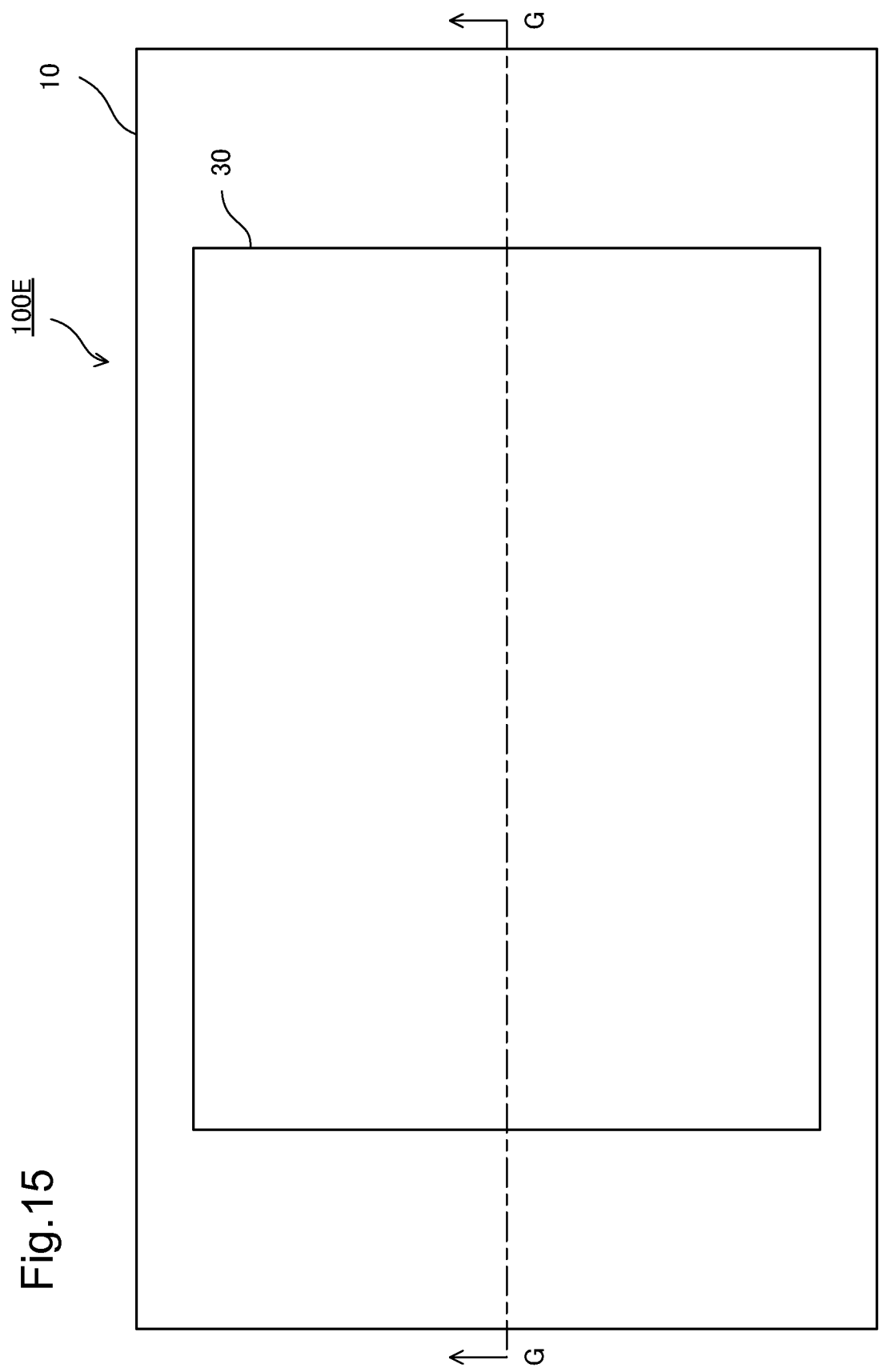
FIG. 15 is a top view illustrating the structure of the electronic apparatus according to the second example embodiment of the present invention.

FIG. 12 is a cross-sectional view illustrating the structure of the electronic apparatus 100E and illustrates a section at a G-G cutting plane in FIG. 15. FIG. 13 is a cross-sectional view illustrating the structure of the electronic apparatus 100E and illustrates a section at an H-H cutting plane in FIG. 14. FIG. 14 is a side view illustrating the structure of the electronic apparatus 100E. FIG. 15 is a top view illustrating the structure of the electronic apparatus 100E.

FIG. 12 and FIG. 14 indicate a vertical direction G. In FIG. 12 to FIG. 15, a component equivalent to each component illustrated in FIG. 1 to FIG. 11 is given a sign equivalent to the sign indicated in FIG. 1 to FIG. 11.

Referring to FIG. 12 to FIG. 15, the electronic apparatus 100E includes a circuit board 10, a heat-generating body 20, an enclosure 30, and a connecting part 70. For example, the electronic apparatus 100E can be used in an electronic module built into a communication device or a server. The circuit board 10 is not an essential component in the present example embodiment and may be omitted.

The electronic apparatus 100E will be compared with the electronic apparatus 100. The electronic apparatus 100E differs from the electronic apparatus 100 in including the connecting part 70.

Referring to FIG. 12 to FIG. 15, the connecting part 70 is placed between the enclosure 30 and the heat-generating body 20 and connects the enclosure 30 to the heat-generating body 20. One end of the connecting part 70 is mounted on an outer circumferential part of a first heat-generating body outer surface 21 of the heat-generating body 20. The other end of the connecting part 70 is mounted on an outer circumferential part of an opening 31 of the enclosure 30. The one end of the connecting part 70 is on the lower side in the vertical direction G and therefore is also a lower end of the connecting part 70. The other end of the connecting part 70 is on the upper side in the vertical direction G and therefore is also an upper end of the connecting part 70. In FIG. 12, the other end of the connecting part 70 may be mounted on an inner circumferential part instead of the outer circumferential part of the opening 31 of the enclosure 30. The connecting part 70 connects the outer circumferential part of the first heat-generating body outer surface 21 to the outer circumferential part or the inner circumferential part of the opening 31. For example, a thermal conductive member is used as a material of the connecting part 70, and, for example, aluminum, an aluminum alloy, copper, or a copper alloy is used.

The above concludes the description of the structure of the electronic apparatus 100E.

Next, a manufacturing method of the electronic apparatus 100E will be described.

First, the heat-generating body 20 mounted on the circuit board 10 is prepared. Next, the enclosure 30 is mounted on the heat-generating body 20 through the connecting part 70. Specifically, the lower end of the connecting part 70 is mounted on the outer circumferential part of the first heat-generating body outer surface 21 of the heat-generating body 20 by use of an adhesive, screwing, or the like. Next, the upper end of the connecting part 70 is mounted on the outer circumferential part or the inner circumferential part of the opening 31 of the enclosure 30 by use of an adhesive, screwing, or the like. Consequently, the outer circumferential part of the first heat-generating body outer surface 21 is connected to the outer circumferential part or the inner circumferential part of the opening 31 by the connecting part 70. At this time, the opening 31 of the enclosure 30 is hermetically sealed by the first heat-generating body outer surface 21 of the heat-generating body 20 through the connecting part 70. Then, the space between the enclosure 30 and the circuit board 10 is filled with a coolant COO.

A method of filling the space between the enclosure 30 and the heat-generating body 20 with a coolant COO is as described in the first example embodiment.

The above concludes the description of the manufacturing method of the electronic apparatus 100E.

Next, an operation of the electronic apparatus 100E will be described.

When the electronic apparatus 100E is started, power is supplied to the heat-generating body 20 on the circuit board 10. Consequently, the heat-generating body 20 generates heat.

The first heat-generating body outer surface 21 of the heat-generating body 20 is in contact with a liquid-phase coolant LP-COO in the enclosure 30. Consequently, the liquid-phase coolant LP-COO stored on the lower side of the enclosure 30 in the vertical direction G is boiled at the first heat-generating body outer surface 21 of the heat-generating body 20 by heat of the heat-generating body 20 and undergoes a phase change to a gas-phase coolant GP-COO. Consequently, gas bubbles of the gas-phase coolant GP-COO are generated. The heat-generating body 20 is cooled by evaporation heat (latent heat) generated by the phase change.

The gas-phase coolant GP-COO rises upward in the vertical direction G in the liquid-phase coolant LP-COO in the enclosure 30 through the connecting part 70, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 20 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 20 again.

The outer circumferential part of the first heat-generating body outer surface 21 of the heat-generating body 20 is connected to the outer circumferential part or the inner circumferential part of the opening 31 of the enclosure 30 through the connecting part 70. Consequently, the heat of the heat-generating body 20 is transferred to the enclosure 30 through the connecting part 70. Consequently, the heat-generating body 20 is cooled.

The above concludes the description of the operation of the electronic apparatus 100E.

As described above, the electronic apparatus 100E according to the second example embodiment of the present invention further includes the connecting part 70. One end (the lower end) of the connecting part 70 is mounted on the outer circumferential part of the first heat-generating body outer surface 21 of the heat-generating body 20. The other end (the upper end) of the connecting part 70 is mounted on the outer circumferential part or the inner circumferential part of the opening 31 of the enclosure 30. The connecting part 70 connects the outer circumferential part of the first heat-generating body outer surface 21 to the outer circumferential part or the inner circumferential part of the opening 31.

Consequently, a distance between the enclosure 30 and the heat-generating body 20 can be increased. Further, a volume for accommodating a coolant COO can be increased by the volume for providing the connecting part 70. Further, a size of the opening 31 can be larger than the size of the first heat-generating body outer surface 21 of the heat-generating body 20. Furthermore, by placing the connecting part 70 between the enclosure 30 and the heat-generating body 20, dimensional variations of the enclosure 30 and the heat-generating body 20 caused during manufacture and deformation of the heat-generating body 20 caused during heat generation can be absorbed.

Further, in the electronic apparatus 100E according to the second example embodiment of the present invention, the connecting part 70 may be formed by an elastic member pressing the outer circumferential part of the first heat-generating body outer surface 21, and the outer circumferential part or the inner circumferential part of the opening 31 of the enclosure 30. For example, bellows can be used as the elastic member. By forming the connecting part 70 with the elastic member, the outer circumferential part of the first heat-generating body outer surface 21, and the outer circumferential part or the inner circumferential part of the opening 31 of the enclosure 30 can always be pressed by an elastic force of the connecting part 70. Consequently, dimensional variations of the enclosure 30 and the heat-generating body 20 caused during manufacture and deformation of the heat-generating body 20 caused during heat generation can be yet more efficiently absorbed. Further, an external force applied to the electronic apparatus 100E can be absorbed by the elastic force of the connecting part 70.

Note that grease or a heat transfer sheet may be placed between the enclosure 30 and the connecting part 70, or between the heat-generating body 20 and the connecting part 70 in order to absorb dimensional variations of the enclosure 30 and the heat-generating body 20 caused during manufacture and deformation of the heat-generating body 20 caused during heat generation. However, heat conduction efficiency of the heat-generating body 20 degrades when grease or a heat transfer sheet is placed in between, compared with a case of grease or a heat transfer sheet not placed in between. On the other hand, as described above, by forming the connecting part 70 in the electronic apparatus 100E, dimensional variations of the enclosure 30 and the heat-generating body 20 caused during manufacture and deformation of the heat-generating body 20 caused during heat generation can be absorbed without placing grease or a heat transfer sheet in between, and degradation in heat conduction efficiency of the heat-generating body 20 can be suppressed.

First Modified Example of Second Example Embodiment

A structure of an electronic apparatus 100F being a first modified example of the electronic apparatus according to the second example embodiment of the present invention will be described based on a drawing.

Figure 16:
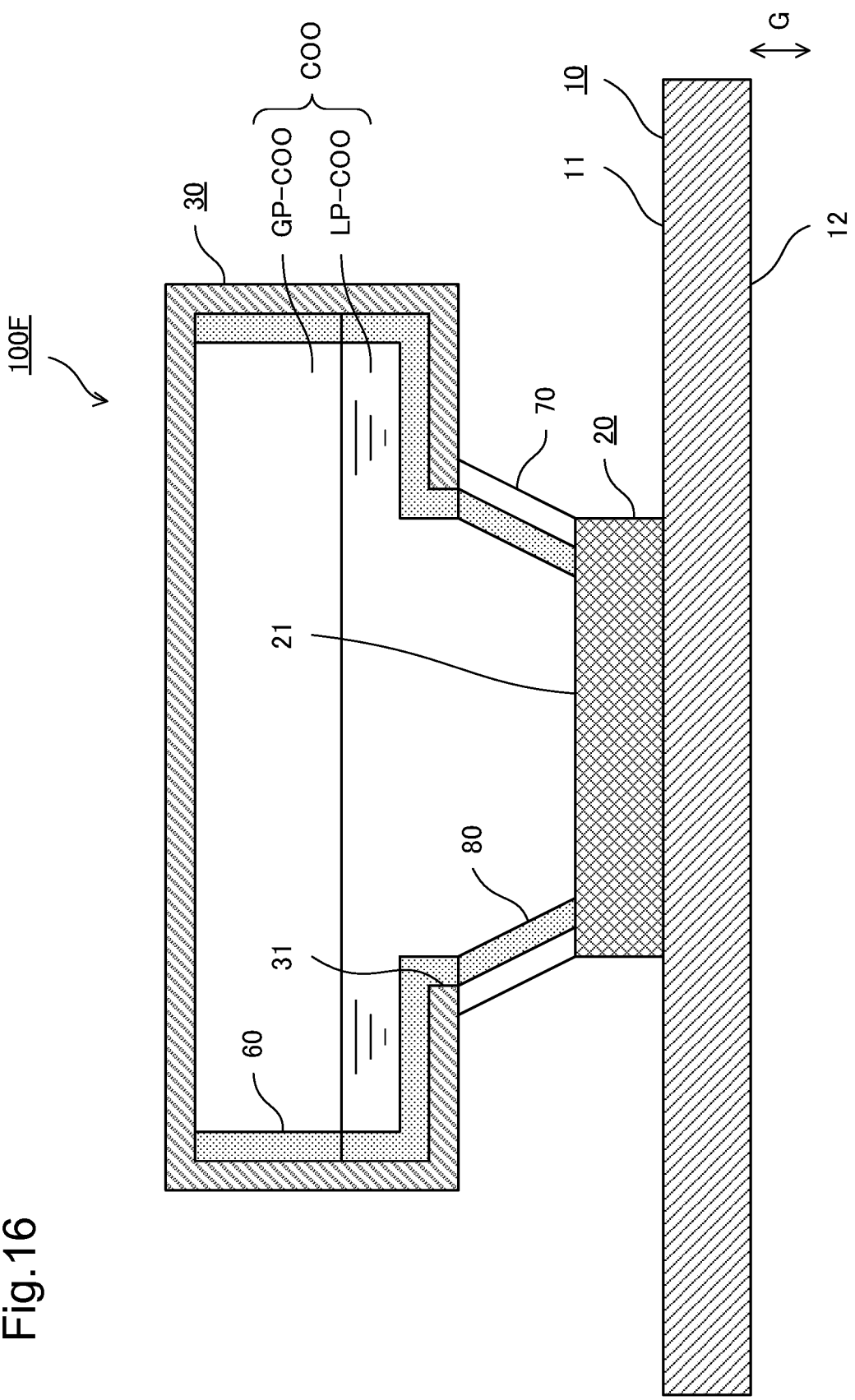
FIG. 16 is a cross-sectional view illustrating a structure of a first modified example of the electronic apparatus according to the second example embodiment of the present invention.

FIG. 16 is a cross-sectional view illustrating the structure of the electronic apparatus 100F. FIG. 16 illustrates a section cut by a cutting plane similar to that in FIG. 12. FIG. 16 indicates a vertical direction G. In FIG. 16, a component equivalent to each component illustrated in FIG. 1 to FIG. 15 is given a sign equivalent to the sign indicated in FIG. 1 to FIG. 15.

Referring to FIG. 16, the electronic apparatus 100F includes a circuit board 10, a heat-generating body 20, an enclosure 30, a connecting part 70, and a second coolant passage 80. For example, the electronic apparatus 100F can be used in an electronic module built into a communication device or a server. The circuit board 10 is not an essential component in the present example embodiment and may be omitted.

The electronic apparatus 100E will be compared with the electronic apparatus 100F. As illustrated in FIG. 16, the electronic apparatus 100F differs from the electronic apparatus 100E in further including a first coolant passage 60 and the second coolant passage 80.

Referring to FIG. 16, the second coolant passage 80 is formed on an inner surface of the connecting part 70. The first coolant passage 60 is as described above by use of FIG. 11.

The second coolant passage 80 is formed in such a way that a liquid-phase coolant LP-COO in the enclosure 30 flows toward the heat-generating body 20, similarly to the first coolant passage 60. For example, the second coolant passage 80 is formed by a porous body or minute grooves guiding the liquid-phase coolant LP-COO to the heat-generating body 20 by a capillary phenomenon, similarly to the first coolant passage 60.

As described by use of FIG. 11, the upper end of the first coolant passage 60 is set above a surface of a liquid-phase coolant LP-COO in the enclosure 30 in the vertical direction G at the minimum amount of the liquid-phase coolant LP-COO. Accordingly, while the upper end of the first coolant passage 60 is set within the sides of the enclosure 30 in the example in FIG. 16, the upper end of the first coolant passage 60 may be set at the bottom of the enclosure 30.

Alternatively, when a surface of a liquid-phase coolant LP-COO in the enclosure 30 at the minimum amount of the liquid-phase coolant LP-COO is set at the connecting part 70, the first coolant passage 60 may not be provided in the enclosure 30. In this case, the second coolant passage 80 has only to be provided on the inner surface of the connecting part 70 from at least the lower end of the connecting part 70 up to above the surface of the liquid-phase coolant LP-COO in the vertical direction G.

The above concludes the description of the structure of the electronic apparatus 100F.

Next, a manufacturing method of the electronic apparatus 100F will be described.

While the manufacturing method differs from the manufacturing method of the electronic apparatus 100E according to the second example embodiment in preparing the enclosure 30 formed with the first coolant passage 60 and the connecting part 70 formed with the second coolant passage 80, the remaining processes are similar to those in the manufacturing method of the electronic apparatus 100E according to the second example embodiment.

The above concludes the description of the manufacturing method of the electronic apparatus 100F.

Next, an operation of the electronic apparatus 100F will be described.

When the electronic apparatus 100F is started, power is supplied to the heat-generating body 20 on the circuit board 10. Consequently, the heat-generating body 20 generates heat.

The central part of a first heat-generating body outer surface 21 of the heat-generating body 20 is in contact with a liquid-phase coolant LP-COO in the enclosure 30. Consequently, the liquid-phase coolant LP-COO stored on the lower side of the enclosure 30 in the vertical direction G is boiled at the first heat-generating body outer surface 21 of the heat-generating body 20 by heat of the heat-generating body H and undergoes a phase change to a gas-phase coolant GP-COO. Consequently, gas bubbles of the gas-phase coolant GP-COO are generated. The heat-generating body 20 is cooled by evaporation heat (latent heat) generated by the phase change.

The gas-phase coolant GP-COO rises upward in the vertical direction G in the liquid-phase coolant LP-COO in the enclosure 30 through the connecting part 70, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 20 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 20 again.

At this time, the liquid-phase coolant LP-COO flows in the first coolant passage 60 and the second coolant passage 80 toward the heat-generating body 20. The liquid-phase coolant LP-COO is guided to the heat-generating body 20 by a capillary phenomenon in the first coolant passage 60 and the second coolant passage 80.

As described above, when a surface of a liquid-phase coolant LP-COO in the enclosure 30 at the minimum amount of the liquid-phase coolant LP-COO is set at the connecting part 70, the first coolant passage 60 may not be provided in the enclosure 30. In this case, the liquid-phase coolant LP-COO flows in the second coolant passage 80 toward the heat-generating body 20. The liquid-phase coolant LP-COO is guided to the heat-generating body 20 by a capillary phenomenon in the second coolant passage 80.

The outer circumferential part of the first heat-generating body outer surface 21 of the heat-generating body 20 is connected to the outer circumferential part or the inner circumferential part of an opening 31 of the enclosure 30 through the connecting part 70. Consequently, heat of the heat-generating body 20 is transferred to the enclosure 30 through the connecting part 70. Consequently, the heat-generating body 20 is cooled.

The above concludes the description of the operation of the electronic apparatus 100F.

As described above, the electronic apparatus 100F being a modified example of the electronic apparatus according to the first example embodiment further includes the second coolant passage 80. The second coolant passage 80 is provided on the inner surface of the connecting part 70 from at least the outer circumferential part of the first heat-generating body outer surface 21 side up to above the surface of a liquid-phase coolant LP-COO in the vertical direction G. The second coolant passage 80 is formed in such a way that the liquid-phase coolant LP-COO flows from the outer circumferential part or the inner circumferential part of the opening 31 to the outer circumferential part of the first heat-generating body outer surface 21.

Thus, the second coolant passage 80 is provided on the inner surface of the connecting part 70 from at least the outer circumferential part of the first heat-generating body outer surface 21 side up to above the surface of the liquid-phase coolant LP-COO in the vertical direction G. The second coolant passage 80 is formed in such a way that the liquid-phase coolant LP-COO flows from the outer circumferential part or the inner circumferential part of the opening 31 to the outer circumferential part of the first heat-generating body outer surface 21. Consequently, the liquid-phase coolant LP-COO generated on the upper side of the enclosure 30 in the vertical direction G flows toward the heat-generating body 20 through the second coolant passage 80. Accordingly, the liquid-phase coolant LP-COO can be more rapidly and smoothly supplied to the heat-generating body 20. Consequently, heat of the heat-generating body 20 can be more efficiently cooled compared with a case of not providing the second coolant passage 80.

Further, in the electronic apparatus 100F being the first modified example of the electronic apparatus according to the second example embodiment, the second coolant passage 80 guides a liquid-phase coolant LP-COO by a capillary phenomenon. Thus, the liquid-phase coolant LP-COO can be guided to the heat-generating body 20 by use of a capillary phenomenon, and therefore the liquid-phase coolant LP-COO can be yet more rapidly and smoothly supplied to the heat-generating body 20. Consequently, heat of the heat-generating body 20 can be yet more efficiently cooled compared with the case of not providing the second coolant passage 80.

Further, in the electronic apparatus 100F being the first modified example of the electronic apparatus according to the second example embodiment, the second coolant passage 80 is formed by grooves or a porous body. Consequently, the second coolant passage 80 generating a capillary phenomenon can be easily formed.

Further, in the electronic apparatus 100F being the first modified example of the electronic apparatus according to the second example embodiment, the connecting part 70 may also be formed by an elastic member pressing the outer circumferential part of the first heat-generating body outer surface 21, and the outer circumferential part or the inner circumferential part of the opening 31 of the enclosure 30, similarly to the electronic apparatus 100E.

Further, in the electronic apparatus 100F being the first modified example of the electronic apparatus according to the second example embodiment, the connecting part 70 may be formed by an elastic member including the second coolant passage 80. In this case, for example, a spiral spring (elastic member) described in PTL 5 acquired by attaching a wick material along a spiral may be used as the connecting part 70. In other words, the spiral spring described in PTL 5 is an elastic member having functions of both the connecting part 70 and the second coolant passage 80. By using such an elastic member, the number of parts can be reduced compared with a case of forming the connecting part 70 and the second coolant passage 80 with separate parts.

Third Example Embodiment

A structure of an electronic apparatus 100G according to a third example embodiment of the present invention will be described based on a drawing.

Figure 17:
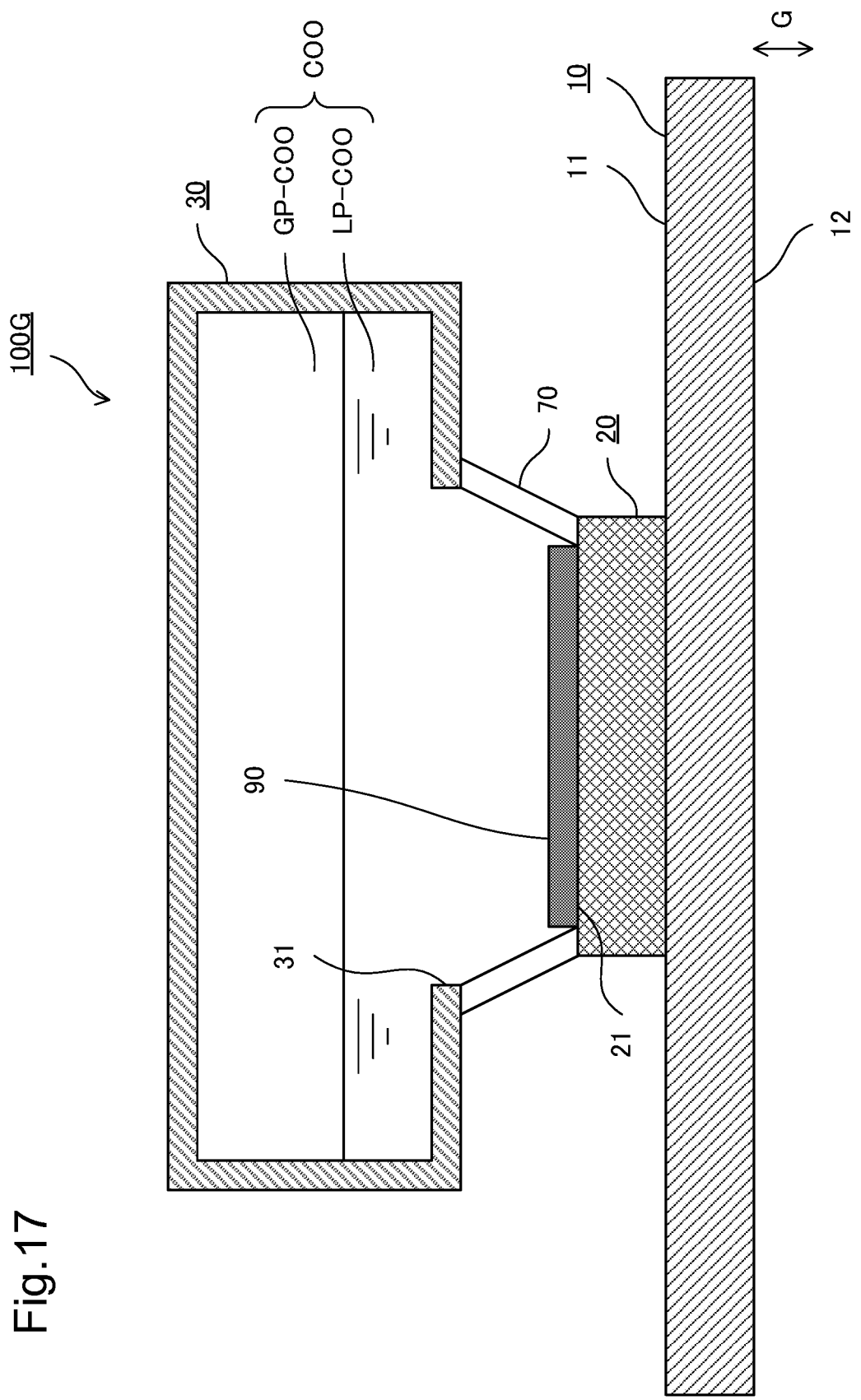
FIG. 17 is a cross-sectional view illustrating a structure of an electronic apparatus according to a third example embodiment of the present invention.

FIG. 17 is a cross-sectional view illustrating the structure of the electronic apparatus 100G. FIG. 17 illustrates a section cut by a cutting plane similar to that in FIG. 12. FIG. 17 indicates a vertical direction G. In FIG. 17, a component equivalent to each component illustrated in FIG. 1 to FIG. 16 is given a sign equivalent to the sign indicated in FIG. 1 to FIG. 16.

Referring to FIG. 17, the electronic apparatus 100G includes a circuit board 10, a heat-generating body 20, an enclosure 30, a connecting part 70, and a boiling acceleration part 90. For example, the electronic apparatus 100G can be used in an electronic module built into a communication device or a server. The circuit board 10 is not an essential component in the present example embodiment and may be omitted.

The electronic apparatus 100E will be compared with the electronic apparatus 100G. As illustrated in FIG. 17, the electronic apparatus 100G differs from the electronic apparatus 100E in including the boiling acceleration part 90.

Referring to FIG. 17, the electronic apparatus 100G further includes the boiling acceleration part 90. The boiling acceleration part 90 is provided on a first heat-generating body outer surface 21 of the heat-generating body 20. The boiling acceleration part 90 accelerates a phase change of a liquid-phase coolant LP-COO around the first heat-generating body outer surface 21 to a gas-phase coolant GP-COO by heat of the heat-generating body 20.

For example, the boiling acceleration part 90 is grooves or a porous body formed on the first heat-generating body outer surface 21. The boiling acceleration part 90 may be a separate body adhered to the first heat-generating body outer surface 21 or may be integrated with the heat-generating body 20 by processing the first heat-generating body outer surface 21. However, the boiling acceleration part 90 is preferably integrated with the heat-generating body 20 by processing the first heat-generating body outer surface 21 rather than being a separate body adhered to the first heat-generating body outer surface 21. When the boiling acceleration part 90 is formed by a separate body adhered to the first heat-generating body outer surface 21, a gap may be generated between the boiling acceleration part 90 and the heat-generating body 20, and heat of the heat-generating body 20 may not be sufficiently conducted to the boiling acceleration part 90. On the other hand, when the boiling acceleration part 90 is formed in such a way as to be integrated with the heat-generating body 20 by processing the first heat-generating body outer surface 21, a gap is not generated between the boiling acceleration part 90 and the heat-generating body 20, and the heat of the heat-generating body 20 can be more efficiently conducted to the boiling acceleration part 90. By providing the boiling acceleration part 90 on the first heat-generating body outer surface 21 of the heat-generating body 20, a boiling nucleus (=a trigger for boiling) can be formed on the heat-generating body 20, and a superheating state (=a state in which boiling does not occur even when a boiling point is exceeded) can be suppressed. Consequently, heat of the heat-generating body 20 is more efficiently transferred to a liquid-phase coolant LP-COO around the first heat-generating body outer surface 21.

Consequently, the liquid-phase coolant LP-COO around the first heat-generating body outer surface 21 can more efficiently undergo a phase change to a gas-phase coolant GP-COO compared with a case of not providing the boiling acceleration part 90.

The above concludes the description of the structure of the electronic apparatus 100G.

Next, a manufacturing method of the electronic apparatus 100G will be described.

While the manufacturing method differs from the manufacturing method of the electronic apparatus 100E according to the second example embodiment in preparing the heat-generating body 20 formed with the boiling acceleration part 90, the remaining processes are similar to those in the manufacturing method of the electronic apparatus 100E according to the second example embodiment.

The above concludes the description of the manufacturing method of the electronic apparatus 100G.

Next, an operation of the electronic apparatus 100G will be described.

When the electronic apparatus 100G is started, power is supplied to the heat-generating body 20 on the circuit board 10. Consequently, the heat-generating body 20 generates heat.

The boiling acceleration part 90 formed on the first heat-generating body outer surface 21 of the heat-generating body 20 is in contact with a liquid-phase coolant LP-COO in the enclosure 30. Consequently, the liquid-phase coolant LP-COO stored on the lower side of the enclosure 30 in the vertical direction G is boiled at the boiling acceleration part 90 by heat of the heat-generating body 20 and undergoes a phase change to a gas-phase coolant GP-COO. Consequently, gas bubbles of the gas-phase coolant GP-COO are generated. The heat-generating body 20 is cooled by evaporation heat (latent heat) generated by the phase change.

The gas-phase coolant GP-COO rises upward in the vertical direction G in the liquid-phase coolant LP-COO in the enclosure 30 through the connecting part 70, passes through the surface of the liquid-phase coolant LP-COO, and further rises upward in the vertical direction G. Then, when cooled by coming in contact with the inner wall surface of the enclosure 30, the gas-phase coolant GP-COO boiled by the heat of the heat-generating body 20 undergoes a phase change to a liquid-phase coolant LP-GOO again. The liquid-phase coolant LP-COO falls downward in the vertical direction G in the enclosure 30, collects on the circuit board 10 side, and is used for cooling of the heat-generating body 20 again.

Further, the outer circumferential part of the first heat-generating body outer surface 21 of the heat-generating body 20 is connected to the outer circumferential part or the inner circumferential part of the opening 31 of the enclosure 30 through the connecting part 70. Consequently, heat of the heat-generating body 20 is transferred to the enclosure 30 through the connecting part 70. Consequently, the heat-generating body 20 is cooled.

The above concludes the description of the operation of the electronic apparatus 100G.

As described above, the electronic apparatus 100G according to the third example embodiment further includes the boiling acceleration part 90. The boiling acceleration part 90 is provided on the first heat-generating body outer surface 21 of the heat-generating body 20. The boiling acceleration part 90 accelerates a phase change of a liquid-phase coolant LP-COO around the first heat-generating body outer surface 21 to a gas-phase coolant GP-COO by heat of the heat-generating body 20.

Thus, by providing the boiling acceleration part 90 on the first heat-generating body outer surface 21 of the heat-generating body 20, a boiling nucleus (=a trigger for boiling) can be formed on the heat-generating body 20, and a superheating state (=a state in which boiling does not occur even when a boiling point is exceeded) can be suppressed. Consequently, heat of the heat-generating body 20 can be more efficiently transferred to a liquid-phase coolant LP-COO around the first heat-generating body outer surface 21. Consequently, the liquid-phase coolant LP-COO around the first heat-generating body outer surface 21 can more efficiently undergo a phase change to a gas-phase coolant GP-COO compared with the case of not providing the boiling acceleration part 90.

Further, in the electronic apparatus 100G according to the third example embodiment, the boiling acceleration part 90 is grooves or a porous body formed on the first heat-generating body outer surface 21. Consequently, the boiling acceleration part 90 can be easily formed.

While an embodiment in which the boiling acceleration part 90 is added to the electronic apparatus 100E has been described in the third example embodiment, the boiling acceleration part 90 may be added to any of the electronic apparatuses 100A to 100F.

The aforementioned example embodiments may also be described in part or in whole as follows but are not limited thereto.

Supplementary Note 1

An electronic apparatus including:

a heat-generating body; and an enclosure including an opening, an outer circumferential part of a first heat-generating body outer surface being an outer surface of the heat-generating body being mounted on an outer circumferential part or an inner circumferential part of the opening in such a way that a coolant that can undergo a phase change to a liquid-phase coolant and a gas-phase coolant is hermetically sealed between the enclosure and the heat-generating body.

Supplementary Note 2

The electronic apparatus according to Supplementary Note 1, further including a first coolant passage being provided on an inner surface of the enclosure from at least the opening up to above a surface of the liquid-phase coolant in a vertical direction and being formed in such a way that the liquid-phase coolant flows toward the heat-generating body.

Supplementary Note 3

The electronic apparatus according to Supplementary Note 2, wherein the first coolant passage guides the liquid-phase coolant to the heat-generating body by a capillary phenomenon.

Supplementary Note 4

The electronic apparatus according to Supplementary Note 3, wherein the first coolant passage is formed by grooves or a porous body.

Supplementary Note 5

The electronic apparatus according to any one of Supplementary Notes 1 to 4, further including
a connecting part connecting an outer circumferential part of the first heat-generating body outer surface to an outer circumferential part or an inner circumferential part of the opening, one end of the connecting part being mounted on an outer circumferential part of the first heat-generating body outer surface and another end of the connecting part being mounted on an outer circumferential part or an inner circumferential part of the opening.

Supplementary Note 6

The electronic apparatus according to Supplementary Note 5, wherein the connecting part is formed by an elastic member pressing an outer circumferential part of the first heat-generating body outer surface, and an outer circumferential part or an inner circumferential part of the opening.

Supplementary Note 7

The electronic apparatus according to Supplementary Note 5 or 6, further including
a second coolant passage being provided on an inner surface of the connecting part from at least an outer circumferential part side of the first heat-generating body outer surface up to above a surface of the liquid-phase coolant in a vertical direction and being formed in such a way that the liquid-phase coolant flows from an outer circumferential part or an inner circumferential part of the opening toward an outer circumferential part of the first heat-generating body outer surface.

Supplementary Note 8

The electronic apparatus according to Supplementary Note 7, wherein
the second coolant passage guides the liquid-phase coolant by a capillary phenomenon.

Supplementary Note 9

The electronic apparatus according to Supplementary Note 8, wherein
the second coolant passage is formed by grooves or a porous body.

Supplementary Note 10

The electronic apparatus according to Supplementary Note 5, wherein
the connecting part is formed by an elastic member including a second coolant passage.

Supplementary Note 11

The electronic apparatus according to any one of Supplementary Notes 1 to 10, further including
a boiling acceleration part being provided on the first heat-generating body outer surface and accelerating a phase change of a liquid-phase coolant around the first heat-generating body outer surface to a gas-phase coolant by heat of the heat-generating body.

Supplementary Note 12

The electronic apparatus according to Supplementary Note 11, wherein
the boiling acceleration part is formed on the first heat-generating body outer surface.

Supplementary Note 13

The electronic apparatus according to Supplementary Note 12, wherein
the boiling acceleration part is grooves or a porous body formed on the first heat-generating body outer surface.

Supplementary Note 14

The electronic apparatus according to any one of Supplementary Notes 1 to 13, wherein
the heat-generating body is mounted on a circuit board, and
the first heat-generating body outer surface is a surface of the heat-generating body opposite to a surface on the circuit board side.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-071069, filed on Apr. 2, 2018, the disclosure of which is incorporated herein in its entirety by reference.

REFERENCE SIGNS LIST

100, 100A, 100B, 100C Electronic apparatus
100D, 100E, 100F, 100G Electronic apparatus
10 Circuit board
11 First principal surface
12 Second principal surface
20 Heat-generating body
21 First heat-generating body outer surface
30 Enclosure
31 Opening
40 Heat-generating body
41 Base
411 Upper surface
42 Die
421 Upper surface
43 Support
50 Heat radiation part
51 Radiator fin
60 First coolant passage
70 Connecting part
80 Second coolant passage
90 Boiling acceleration part
COO Coolant
LP-COO Liquid-phase coolant
GP-COO Gas-phase coolant

What is claimed is:

1. An electronic apparatus comprising:
a circuit board;
a heat-generating body mounted on the circuit board, an outer circumferential part of a heat-generating body outer surface being an outer surface of the heat-generating body facing away from the circuit board, and the heat-generating body is mounted on the circuit board;
an enclosure including an opening, the opening having an outer circumferential part or an inner circumferential part; and
a connecting part connecting the outer circumferential part of the heat-generating body outer surface to the outer circumferential part or the inner circumferential part of the opening in such a way that a coolant is configured to undergo a phase change between a liquid-phase of the coolant and a gas-phase of the coolant, the coolant is hermetically sealed between the enclosure and the heat-generating body by the connecting part, one end of the connecting part being attached to the outer circumferential part of the heat-generating body outer surface and another end of the connecting part being attached to the outer circumferential part or the inner circumferential part of the opening;
wherein the heat-generating body directly comes in contact with the liquid-phase of the coolant at the opening; and the connecting part is formed by an elastic member pressing the outer circumferential part of the heat-generating body outer surface, and the outer circumferential part or the inner circumferential part of the opening.

2. The electronic apparatus according to claim 1, further comprising a coolant passage being provided on an inner surface of the enclosure from at least the opening up to above a surface of the liquid-phase of the coolant in a vertical direction, the coolant passage being formed in such a way that the liquid-phase of the coolant flows toward the heat-generating body.

3. The electronic apparatus according to claim 2, wherein the coolant passage guides the liquid-phase of the coolant toward the heat-generating body by a capillary phenomenon.

4. The electronic apparatus according to claim 3, wherein the coolant passage is formed by grooves or a porous body.

5. The electronic apparatus according to claim 1, further comprising a coolant passage being provided on an inner surface of the connecting part from at least an outer circumferential part side of the heat-generating body outer surface up to above a surface of the liquid-phase of the coolant in a vertical direction and being formed in such a way that the liquid-phase of the coolant flows from the outer circumferential part or the inner circumferential part of the opening toward the outer circumferential part of the heat-generating body outer surface.

6. The electronic apparatus according to claim 5, wherein the coolant passage guides the liquid-phase of the coolant by a capillary phenomenon.

7. The electronic apparatus according to claim 6, wherein the coolant passage is formed by grooves or a porous body.

8. The electronic apparatus according to claim 1, wherein the elastic member comprises a first coolant passage and a second coolant passage.

9. The electronic apparatus according to claim 1, further comprising a boiling acceleration part being provided on the heat-generating body outer surface and accelerating the phase change of the liquid-phase of the coolant around the heat-generating body outer surface to the gas-phase of the coolant by heat of the heat-generating body.

10. The electronic apparatus according to claim 9, wherein the boiling acceleration part is grooves or a porous body formed on the heat-generating body outer surface.

* * * * *